United States Patent
Hayashi

(10) Patent No.: US 9,627,638 B2
(45) Date of Patent: Apr. 18, 2017

(54) ORGANIC ELECTROLUMINESCENCE DEVICE AND METHOD FOR PRODUCING THE SAME

(75) Inventor: Naoyuki Hayashi, Ashigarakami-gun (JP)

(73) Assignee: UDC Ireland Limited, Dublin (IE)

(*) Notice: Subject to any disclaimer, the term of this patent is extended or adjusted under 35 U.S.C. 154(b) by 1184 days.

(21) Appl. No.: 13/634,178

(22) PCT Filed: Mar. 9, 2011

(86) PCT No.: PCT/JP2011/056125
§ 371 (c)(1),
(2), (4) Date: Sep. 11, 2012

(87) PCT Pub. No.: WO2011/111860
PCT Pub. Date: Sep. 15, 2011

(65) Prior Publication Data
US 2013/0001541 A1   Jan. 3, 2013

(30) Foreign Application Priority Data

Mar. 12, 2010 (JP) .................. 2010-056016
Mar. 1, 2011 (JP) .................. 2011-044394

(51) Int. Cl.
| | | |
|---|---|---|
| H01L 51/54 | (2006.01) |
| C09K 11/06 | (2006.01) |
| H01L 51/50 | (2006.01) |
| H05B 33/10 | (2006.01) |
| H01L 51/00 | (2006.01) |

(52) U.S. Cl.
CPC .......... *H01L 51/5016* (2013.01); *C09K 11/06* (2013.01); *H01L 51/0085* (2013.01); *H01L 51/0087* (2013.01); *H01L 51/5004* (2013.01); *H05B 33/10* (2013.01); *C09K 2211/1007* (2013.01); *C09K 2211/1011* (2013.01); *C09K 2211/1014* (2013.01); *H01L 51/006* (2013.01); *H01L 51/0059* (2013.01); *H01L 51/5048* (2013.01); *H01L 51/5088* (2013.01)

(58) Field of Classification Search
CPC .... H05B 33/10; C09K 11/06; C09K 2211/00; C09K 2211/10; C09K 2211/1007; C09K 2211/1011; C09K 2211/1014; C09K 2211/1018; C09K 2211/1029; C09K 2211/1044; H01L 51/0032; H01L 51/005; H01L 51/0059; H01L 51/006; H01L 51/0072; H01L 51/0085; H01L 51/0087; H01L 51/50; H01L 51/5004; H01L 51/5012; H01L 51/5016; H01L 51/5048; H01L 51/5052; H01L 51/50506; H01L 51/506; H01L 51/5064; H01L 51/5088; H01L 2251/552; H01L 2251/554; H01L 2251/5346

USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

| | | | |
|---|---|---|---|
| 6,541,909 B1* | 4/2003 | Motomatsu | 313/504 |
| 2006/0051611 A1* | 3/2006 | Brunner | C08G 61/123 428/690 |
| 2006/0240279 A1* | 10/2006 | Adamovich et al. | 428/690 |
| 2007/0009759 A1* | 1/2007 | Burn | C07F 15/0033 428/690 |
| 2007/0099026 A1* | 5/2007 | Lee et al. | 428/690 |
| 2009/0085474 A1* | 4/2009 | Shitagaki | H01L 51/5048 313/504 |
| 2009/0309487 A1* | 12/2009 | Royster et al. | 313/504 |
| 2010/0171101 A1 | 7/2010 | Tanaka et al. | |

FOREIGN PATENT DOCUMENTS

| | | | |
|---|---|---|---|
| JP | 2007123392 A * | 5/2007 |
| JP | 2007-169606 A | 7/2007 |
| JP | 2007-242910 A | 9/2007 |
| JP | 2008-78373 A | 4/2008 |
| WO | 2007/119473 A1 | 10/2007 |
| WO | 2008/073440 | 6/2008 |
| WO | 2009/030981 A2 | 3/2009 |

OTHER PUBLICATIONS

Machine translation of JP2007-123392. Date of publication: May 17, 2007.*
Choi et al. Organic Electronics 2010, 11, 872-875. Date of online publication: Feb. 10, 2010.*
Ho et al. Thin Solid Films 2008, 517, 943-947. Date of publication: Jul. 19, 2008.*
International Search Report for PCT/JP2011/056125 dated Apr. 26, 2011.

* cited by examiner

*Primary Examiner* — Andrew K Bohaty
(74) *Attorney, Agent, or Firm* — Riverside Law LLP

(57) ABSTRACT

An organic electroluminescence device including an anode, a cathode, an organic layer disposed between the anode and the cathode, the organic layer containing a hole injection layer, a hole transport layer and an emission layer containing a host material, wherein the hole injection layer, the hole transport layer and the emission layer each contain a phosphorescent light-emitting material, wherein the hole injection layer contains the phosphorescent light-emitting material in an amount of 10% by mass or more but less than 50% by mass, and wherein a concentration of the phosphorescent light-emitting material contained in the hole transport layer is lower than that in the hole injection layer, and a concentration of the phosphorescent light-emitting material contained in the emission layer is lower than that in the hole injection layer and higher than that in the hole transport layer.

11 Claims, 4 Drawing Sheets

ORGANIC ELECTROLUMINESCENCE DEVICE AND METHOD FOR PRODUCING THE SAME

CROSS REFERENCE TO RELATED APPLICATIONS

This application is a National Stage of International Application No. PCT/JP2011/056125 filed Mar. 9, 2011, claiming priority based on Japanese Patent Application Nos. 2010-056016 filed Mar. 12, 2010 and 2011-044394 filed Mar. 1, 2011, the contents of all of which are incorporated herein by reference in their entirety.

TECHNICAL FIELD

The present invention relates to an organic electroluminescence device and a method for producing the organic electroluminescence device.

BACKGROUND ART

Organic electroluminescence devices have advantageous features such as self emission and high-speed response, and are expected for the application to flat panel displays. In particular, since such organic electroluminescence devices were reported that have a dual-layer structure (lamination type) in which a hole-transporting organic thin film (hole transport layer) is laminated on an electron-transporting organic thin film (electron transport layer), organic electroluminescence devices have been attracting attention as a large-area light-emitting device that emits light at a low voltage of 10 V or lower. The organic electroluminescence devices of lamination type have a basic structure of anode/hole transport layer/emission layer/electron transport layer/cathode.

Various attempts have been made to elongate the service life of such organic electroluminescence devices. For example, PTL 1 and other literatures disclose an organic electroluminescence device including an emission layer containing a host material in an amount of 50% by mass or more and a hole transport layer containing the host material in an amount of 5% by mass to 50% by mass or more, wherein the emission layer contains substantially no material other than the host material among the hole transporting materials contained in the hole transport layer.

Also, PTL 2 and other literatures disclose an organic electroluminescence device including a hole injection layer, a hole transport layer and an emission layer each containing a phosphorescent light-emitting material, wherein the hole injection layer contains the phosphorescent light-emitting material in an amount of 10% by mass to 90% by mass and wherein the concentration of the phosphorescent light-emitting material contained in the hole transport layer is lower than that in the hole injection layer and higher than that in the emission layer.

In addition, PTL 3 and other literatures disclose an organic electroluminescence device including a hole injection layer, a hole transport layer, an emission layer and a mixture layer, wherein the mixture layer is disposed between the emission layer and the hole injection layer or the hole transport layer.

However, these organic electroluminescence devices cannot attain high external quantum efficiency although their service life is elongated.

In view of this, keen demand has arisen for development of an organic electroluminescence device exhibiting high external quantum efficiency and a method for producing the organic electroluminescence device.

CITATION LIST

Patent Literature

PTL 1: Japanese Patent Application Laid-Open (JP-A) No. 2008-78373
PTL 2: International Publication No. WO09/030981
PTL 3: JP-A No. 2007-242910

SUMMARY OF INVENTION

Technical Problem

The present invention solves the above existing problems and aims to achieve the following object. Specifically, an object of the present invention is to provide an organic electroluminescence device having high external quantum efficiency and a method for producing the organic electroluminescence device.

Solution to Problem

Means for solving the above existing problems are as follows.
<1> An organic electroluminescence device including:
an anode,
a cathode,
an organic layer disposed between the anode and the cathode,
the organic layer containing a hole injection layer, a hole transport layer and an emission layer containing a host material,
wherein the hole injection layer, the hole transport layer and the emission layer each contain a phosphorescent light-emitting material,
wherein the hole injection layer contains the phosphorescent light-emitting material in an amount of 10% by mass or more but less than 50% by mass, and
wherein a concentration of the phosphorescent light-emitting material contained in the hole transport layer is lower than that in the hole injection layer, and a concentration of the phosphorescent light-emitting material contained in the emission layer is lower than that in the hole injection layer and higher than that in the hole transport layer.
<2> The organic electroluminescence device according to <1>, wherein the hole transport layer further contains the host material.
<3> The organic electroluminescence device according to <2>, wherein a ratio by mass of the phosphorescent light-emitting material to the host material in the emission layer is one to ten times a ratio by mass of the phosphorescent light-emitting material to the host material in the hole transport layer.
<4> The organic electroluminescence device according to any one of <1> to <3>, wherein the concentration of the phosphorescent light-emitting material contained in the hole transport layer is changed from an interface between the hole transport layer and the emission layer to an interface between the hole transport layer and the hole injection layer.
<5> The organic electroluminescence device according to any one of <2> to <4>, wherein the concentration of the host material contained in the hole transport layer is changed from an interface between the hole transport layer and the emission layer to an interface between the hole transport layer and the hole injection layer.

<6> The organic electroluminescence device according to any one of <1> to <5>, wherein the phosphorescent light-emitting material has an asymmetric structure.

<7> The organic electroluminescence device according to any one of <1> to <6>, wherein the phosphorescent light-emitting material is a compound represented by General Formula (1) below:

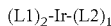

$$(L1)_2\text{-Ir-}(L2)_1 \qquad \text{General Formula (1)}$$

where L1 denotes a ligand and L2 denotes a ligand different from L1.

<8> The organic electroluminescence device according to any one of <1> to <7>, wherein the host material is a compound represented by General Formula (2) below:

General Formula (2)

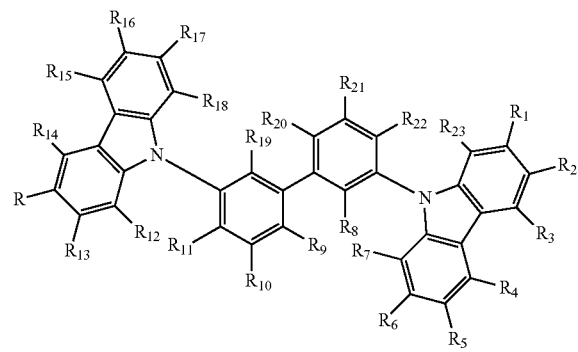

where R represents a t-butyl group, a t-amyl group, a trimethylsilyl group, a triphenylsilyl group or a phenyl group, and $R_1$ to $R_{23}$ each represent a hydrogen atom, a C1-C5 alkyl group, a cyano group, a fluorine atom, a trifluoro group, a trimethylsilyl group, a triphenylsilyl group or a phenyl group.

<9> The organic electroluminescence device according to any one of <1> to <8>, wherein the hole injection layer further contains an arylamine derivative and an ionization potential of the arylamine derivative is 4.8 eV to 5.8 eV and wherein a difference between the ionization potential of the arylamine derivative and an ionization potential of the phosphorescent light-emitting material contained in the hole injection layer is within ±0.2 eV.

<10> An organic electroluminescence device-producing method for producing the organic electroluminescence device according to any one of <1> to <9>, including:

forming the hole injection layer, the hole transport layer and the emission layer through coating.

<11> The organic electroluminescence device-producing method according to <10>, wherein the phosphorescent light-emitting material is soluble to a solvent used for the coating.

Advantageous Effects of Invention

The present invention can provide an organic electroluminescence device exhibiting high external quantum efficiency and a method for producing the organic electroluminescence device. These can solve the above existing problems and achieve the above object.

DESCRIPTION OF EMBODIMENTS (Organic Electroluminescence Device)

An organic electroluminescence device of the present invention includes a pair of electrodes (anode and cathode) and an organic layer disposed between the electrodes; and, if necessary, further includes other layers.

<Organic Layer>

The organic layer includes at least a hole injection layer, a hole transport layer and an emission layer; and, if necessary, further includes other layers.

<<Hole Injection Layer and Hole Transport Layer>>

The hole injection layer and hole transport layer are layers having the function of receiving holes from the anode or from the anode side and transporting the holes to the cathode side. Each of the hole injection layer and the hole transport layer may have a single-layered structure or a multi-layered structure made of a plurality of layers which are identical or different in composition.

The hole injection layer and the hole transport layer each contain a phosphorescent light-emitting material.

The amount of the phosphorescent light-emitting material contained in the hole injection layer is not particularly limited, so long as it is 10% by mass or more but less than 50% by mass, and may be appropriately selected depending on the intended purpose. The amount thereof is preferably 20% by mass to 45% by mass, more preferably 20% by mass to 40% by mass, particularly preferably 25% by mass to 40% by mass.

When the amount of the phosphorescent light-emitting material contained in the hole injection layer is less than 10% by mass, the concentration by volume of the phosphorescent light-emitting material may be low. When the amount thereof is 50% by mass or higher, the hole injection layer may be peeled off or dissolved when the hole transport layer is formed on the hole injection layer. When the amount of the phosphorescent light-emitting material contained in the hole injection layer falls within the above particularly preferable range, the hole transport layer can be laminated on the hole injection layer through wet coating, and also, EL efficiency is advantageously increased by the addition of the phosphorescent light-emitting material.

Figure 1:
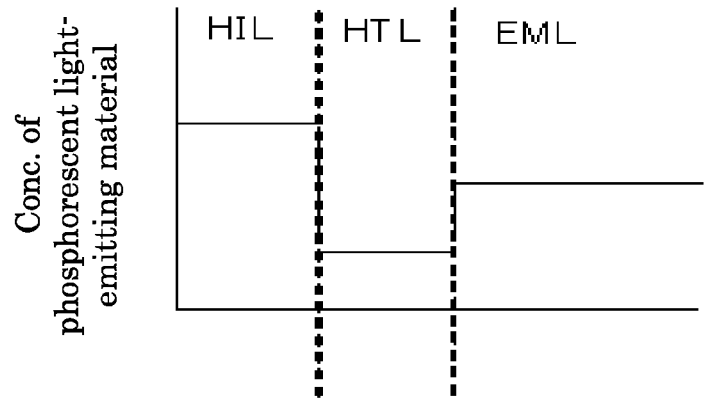
FIG. 1 is a graph showing the concentration of a phosphorescent light-emitting material contained in a hole injection layer, a hole transport layer and an emission layer of an organic electroluminescence device of the present invention (part 1).
Figure 2:
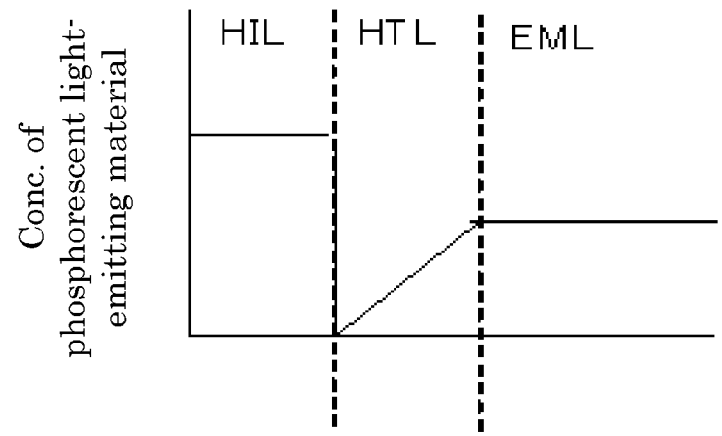
FIG. 2 is a graph showing the concentration of a phosphorescent light-emitting material contained in a hole injection layer, a hole transport layer and an emission layer of an organic electroluminescence device of the present invention (part 2).

The concentration of the phosphorescent light-emitting material contained in the hole transport layer (HTL) is not particularly limited, so long as it is lower than that in the hole injection layer (HIL) as shown in, for example, FIG. 1, and may be appropriately selected depending on the intended purpose. The concentration thereof is preferably changed from an interface between the hole transport layer and the emission layer (EML) to an interface between the hole transport layer and the hole injection layer. The manner in which the concentration thereof is changed is not particularly limited and may be appropriately selected depending on the intended purpose. For example, the concentration thereof is preferably successively (gradually) changed as shown in FIG. 2. Notably, the above-described hole transport layer (in which the concentration of the phosphorescent light-emitting material is successively (gradually) changed form the interface between the hole transport layer and the emission layer to the interface between the hole transport layer and the hole injection layer) can be formed as a result that the phosphorescent light-emitting material contained in the emission layer formed through coating is transferred (diffused) into the hole transport layer.

—Phosphorescent Light-Emitting Material—

In general, examples of the phosphorescent light-emitting material include complexes containing a transition metal atom or a lanthanoid atom. The phosphorescent light-emitting material preferably has an asymmetric structure.

The transition metal atom is not particularly limited and may be selected depending on the intended purpose. Preferred are ruthenium, rhodium, palladium, tungsten, rhenium, osmium, iridium and platinum. More preferred are rhenium, iridium and platinum. Particularly preferred are iridium and platinum.

The lanthanoid atom is not particularly limited and may be appropriately selected depending on the intended purpose. Examples thereof include lanthanum, cerium, praseodymium, neodymium, samarium, europium, gadolinium, terbium, dysprosium, holmium, erbium, thulium, ytterbium and lutetium, with neodymium, europium and gadolinium being preferred.

The ligand in the complexes is not particularly limited and may be appropriately selected depending on the intended purpose. Examples thereof include those described in, for example, "Comprehensive Coordination Chemistry" authored by G. Wilkinson et al., published by Pergamon Press Company in 1987; "Photochemistry and Photophysics of Coordination Compounds" authored by H. Yersin, published by Springer-Verlag Company in 1987; and "*YUHKI KINZOKU KAGAKU—KISO TO OUYOU*—(Metalorganic Chemistry—Fundamental and Application—)" authored by Akio Yamamoto, published by Shokabo Publishing Co., Ltd. in 1982.

The ligand is not particularly limited and may be appropriately selected depending on the intended purpose. Preferred are halogen ligands, preferably, chlorine ligand; aromatic carbon ring ligands such as cyclopentadienyl anion, benzene anion and naphthyl anion; nitrogen-containing hetero cyclic ligands such as phenyl pyridine, benzoquinoline, quinolinol, bipyridyl and phenanthrorine); diketone ligands such as acetyl acetone; carboxylic acid ligands such as acetic acid ligand); alcoholate ligands such as phenolate ligand; carbon monoxide ligand; isonitrile ligand; and cyano ligand, with nitrogen-containing hetero cyclic ligands being more preferred.

The above-described complexes may be a complex containing one transition metal atom in the compound, or a so-called polynuclear complex containing two or more transition metal atoms. In the latter case, the complexes may contain different metal atoms at the same time. Examples of the phosphorescent light-emitting material include Ir complexes and Pt complexes. The Ir complexes are preferably those represented by the following General Formula (1). Also, specific examples of the Ir complexes and Pt complexes include the following Ir complexes and Pt complexes, but employable phosphorescent light-emitting materials are not construed as being limited thereto.

General Formula (1)

$(L_1)_2$—Ir—$(L_2)_1$

Structural Formula (1)

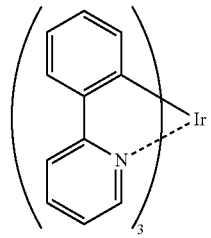

Structural Formula (2)

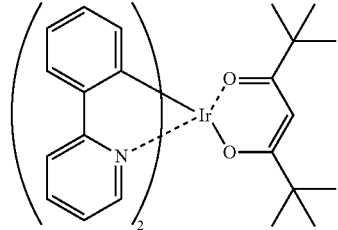

Structural Formula (3)

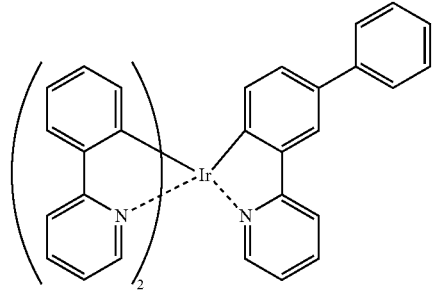

Structural Formula (7)

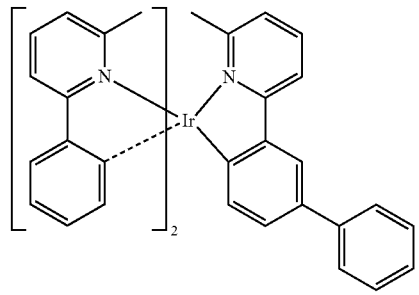

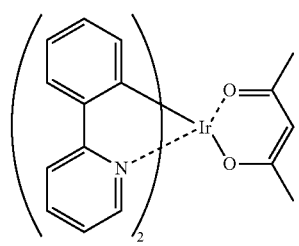

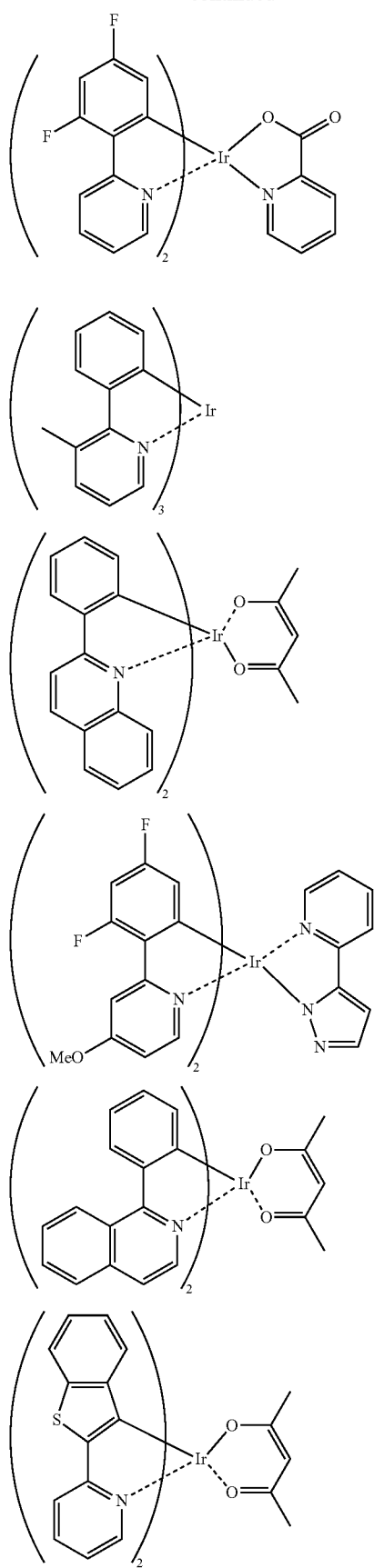
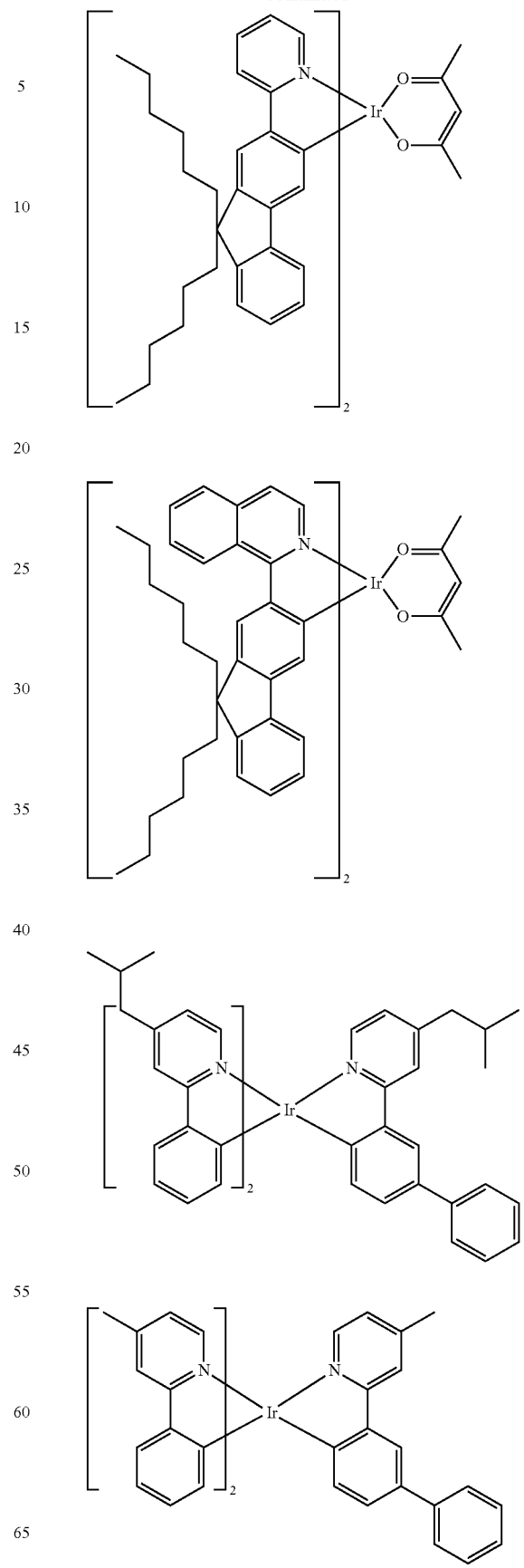

-continued
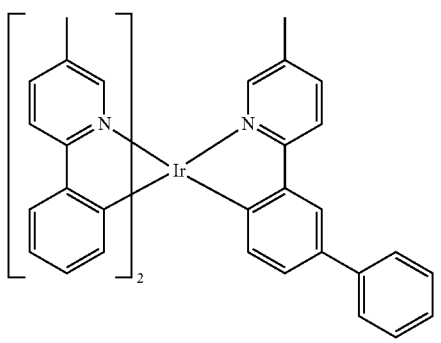
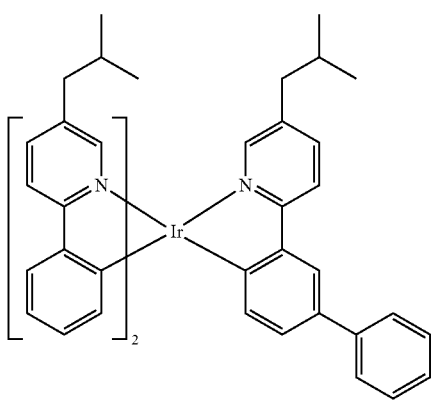
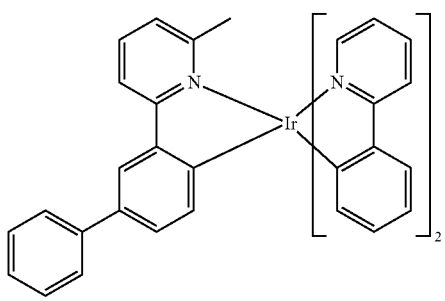
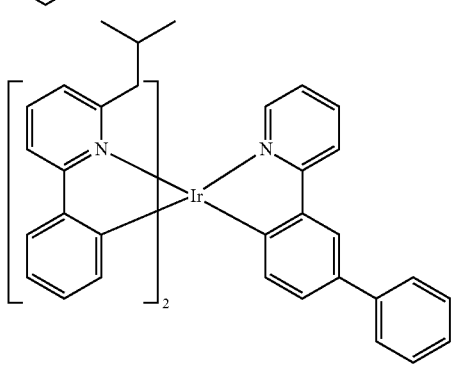
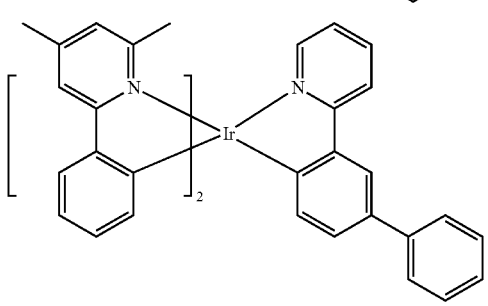
-continued
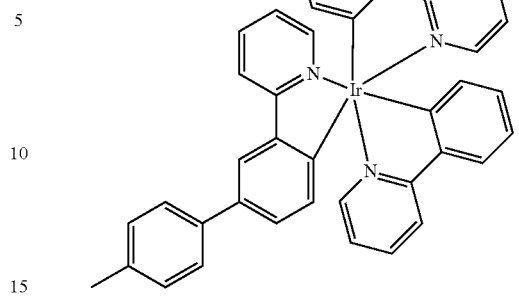
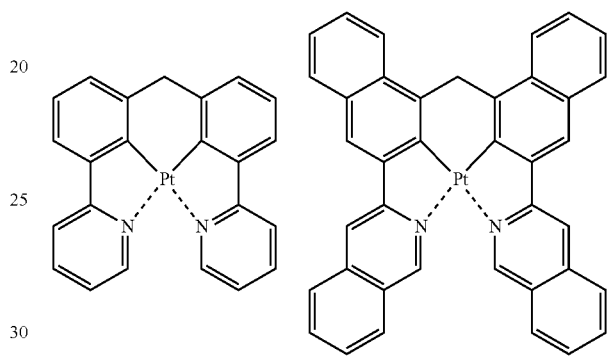
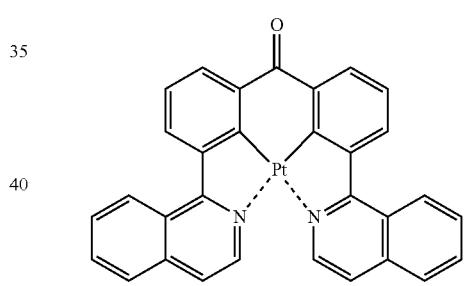
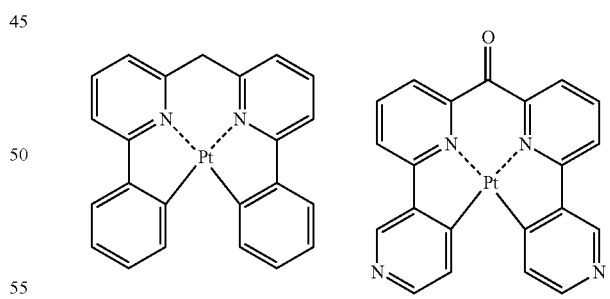
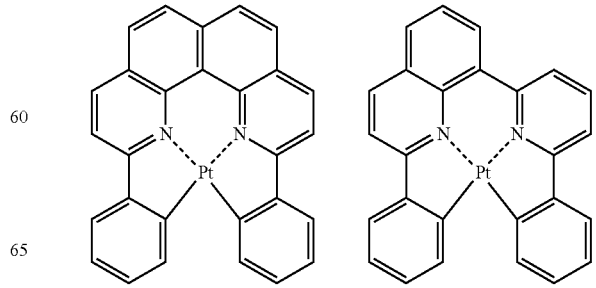

11
-continued
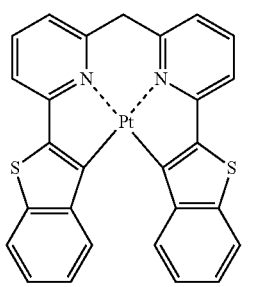
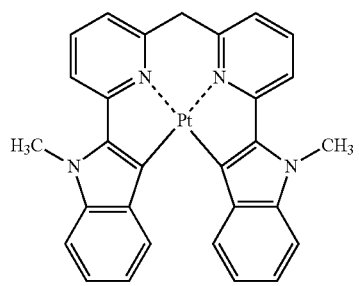
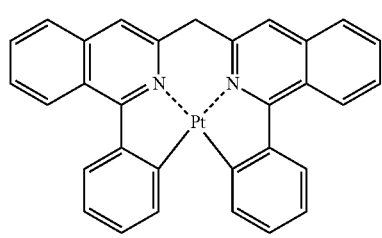
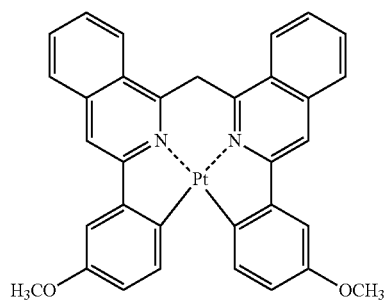
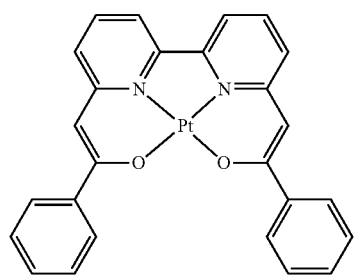
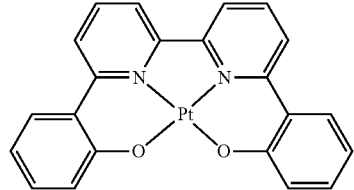
12
-continued
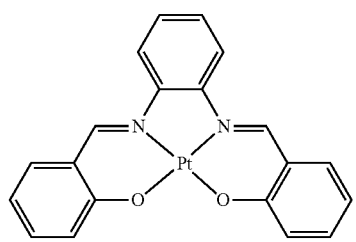
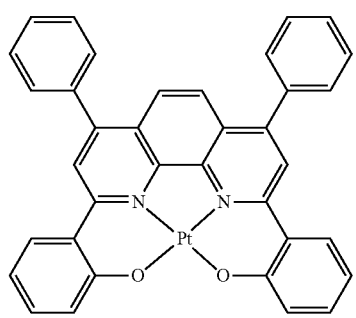
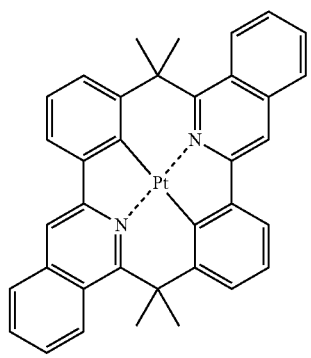
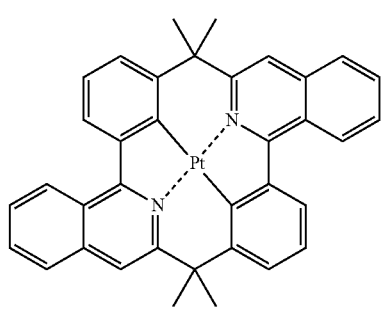
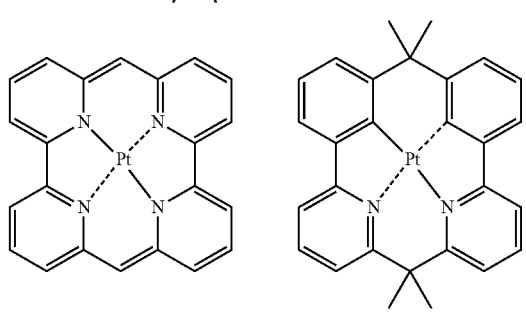

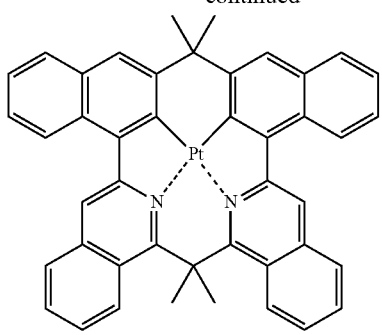
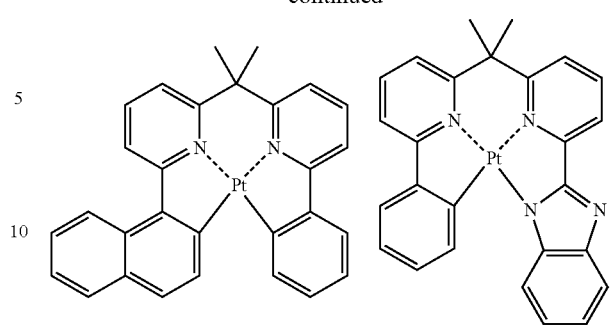
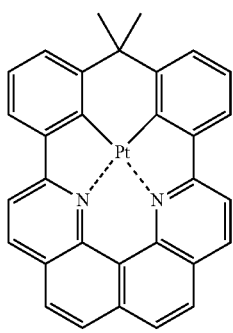
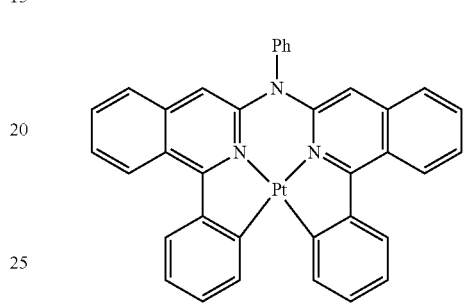
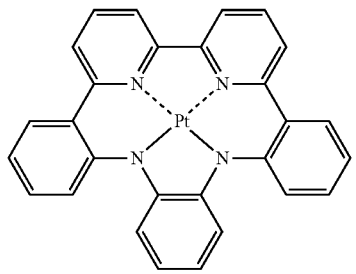
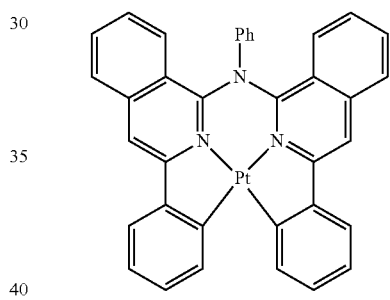
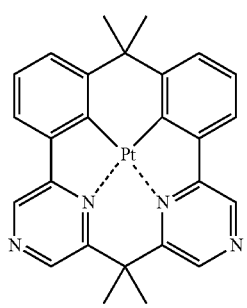
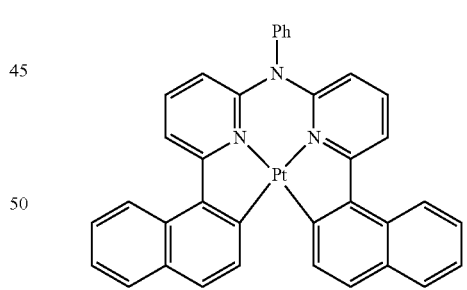
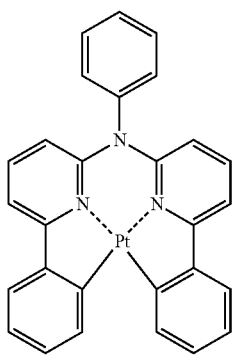
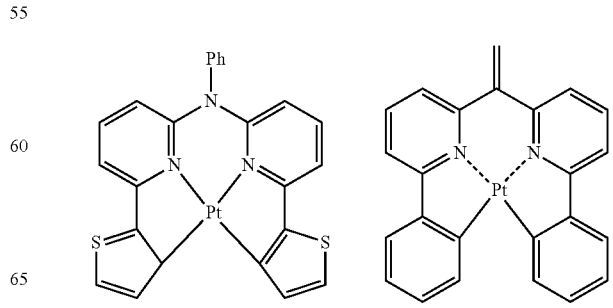

-continued

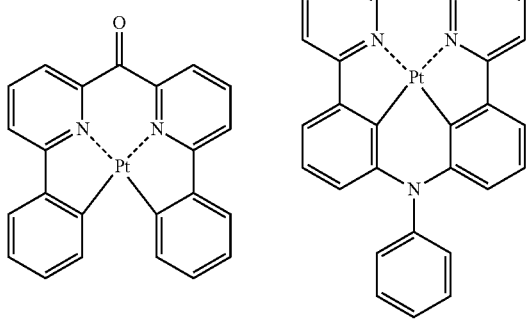

Of these, particularly preferred are compounds having asymmetric structures expressed by Structural Formulas (2), (3) and (7), since they are soluble to a solvent used for the formation, through coating, of the hole injection layer, the hole transport layer and the emission layer. The asymmetric structure refers to a structure in which at least one of the ligands coordinating with the central metal is different from the other ligands like the compounds having Structural Formulas (2), (3) and (7). Furthermore, like the compounds having Structural Formulas (3) and (7), complexes which have asymmetric structures and whose ligands are coordinated via only C and N are more preferred, since they exhibit high thermodecomposition temperature.

The solvent is not particularly limited and may be appropriately selected depending on the intended purpose. Examples thereof include cyclohexanone, tetrahydrofuran, toluene, xylene and 2-butanone.

The drying temperature is a temperature higher than the boiling point of the solvent, more preferably a temperature higher by 10° C. than the boiling temperature of the solvent. The drying time is several minutes to several hours, more preferably 2 min to 120 min. Notably, vacuum drying, an inert oven (inert gas atmosphere), etc. may be appropriately employed.

Figure 3:
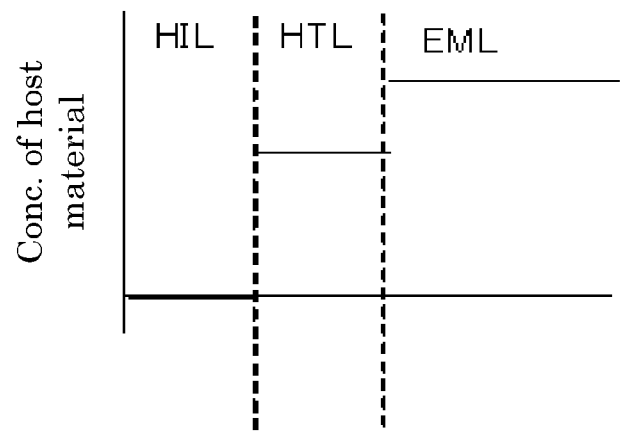
FIG. 3 is a graph showing the concentration of a host material contained in a hole injection layer, a hole transport layer and an emission layer of an organic electroluminescence device of the present invention (part 1).

The hole transport layer (HTL) is not particularly limited, so long as it contains the phosphorescent light-emitting material, and may be appropriately selected depending on the intended purpose. Preferably, the hole transport layer contains the host material as shown in FIG. 3, for example.

Figure 4:
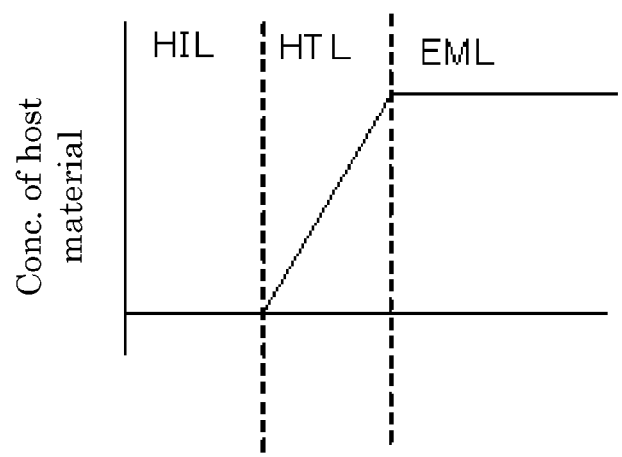
FIG. 4 is a graph showing the concentration of a host material contained in a hole injection layer, a hole transport layer and an emission layer of an organic electroluminescence device of the present invention (part 2).

The concentration of the host material contained in the hole transport layer (HTL) is preferably changed from the interface between an interface between the hole transport layer (HTL) and the emission layer (EML) to an interface between the hole transport layer (HTL) and the hole injection layer (HIL). The manner in which the concentration thereof is changed is not particularly limited and may be appropriately selected depending on the intended purpose. For example, the concentration thereof is preferably successively (gradually) changed as shown in FIG. 4. Notably, the above-described hole transport layer (in which the concentration of the host material is successively (gradually) changed form the interface between the hole transport layer and the emission layer to the interface between the hole transport layer and the hole injection layer) can be formed as a result that the host material contained in the emission layer formed through coating is transferred (diffused) into the hole transport layer.

—Host Material—

The host material is not particularly limited and may be appropriately selected depending on the intended purpose. Examples thereof include hole transporting hosts such as compounds represented by the following General Formulas (2) and (3).

General Formula (2)

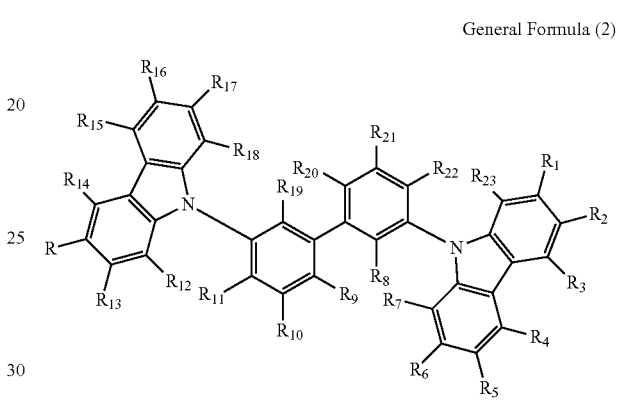

where R represents a t-butyl group, a t-amyl group, a trimethylsilyl group, a triphenylsilyl group or a phenyl group, and $R_1$ to $R_{23}$ each represent a hydrogen atom, a C1-C5 alkyl group, a cyano group, a fluorine atom, a trifluoro group, a trimethylsilyl group, a triphenylsilyl group or a phenyl group.

General Formula (3)

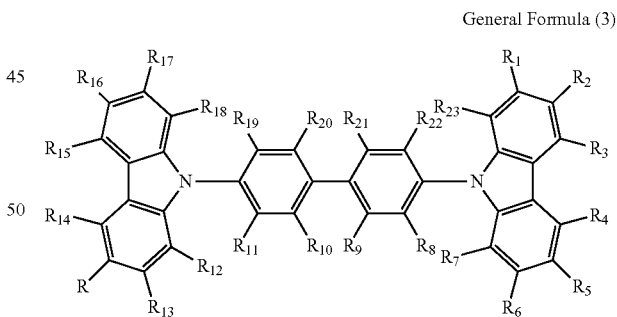

where R represents a t-butyl group, a t-amyl group, a trimethylsilyl group, a triphenylsilyl group or a phenyl group, and $R_1$ to $R_{23}$ each represent a hydrogen atom, a C1-C5 alkyl group, a cyano group, a fluorine atom, a trifluoro group, a trimethylsilyl group, a triphenylsilyl group or a phenyl group.

The hole transporting host materials represented by General Formula (2) are not particularly limited and may be appropriately selected depending on the intended purpose. Examples thereof include the following compounds.

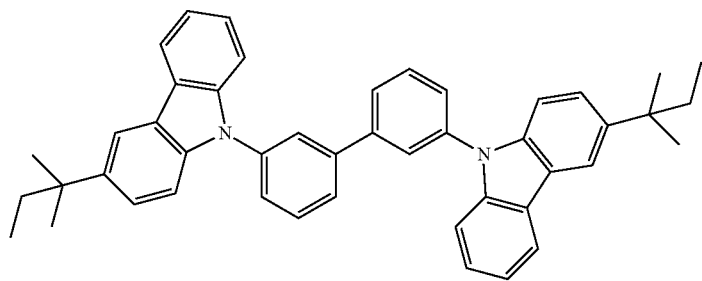
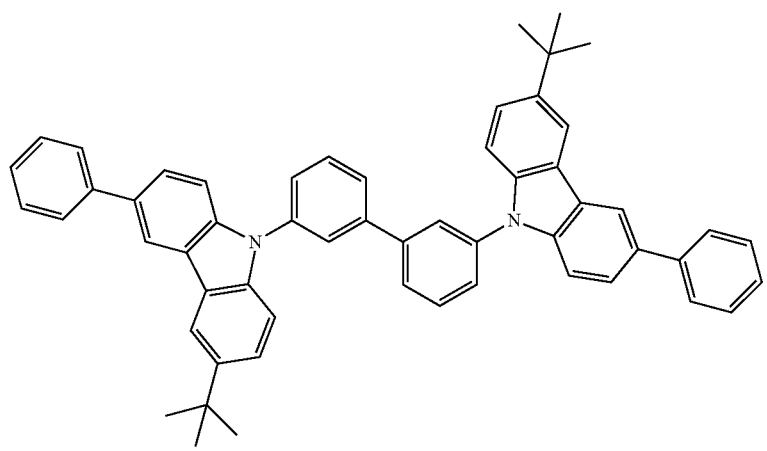
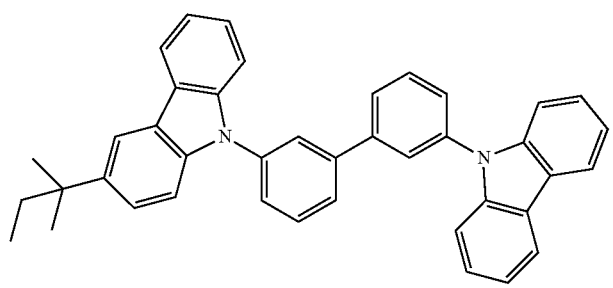
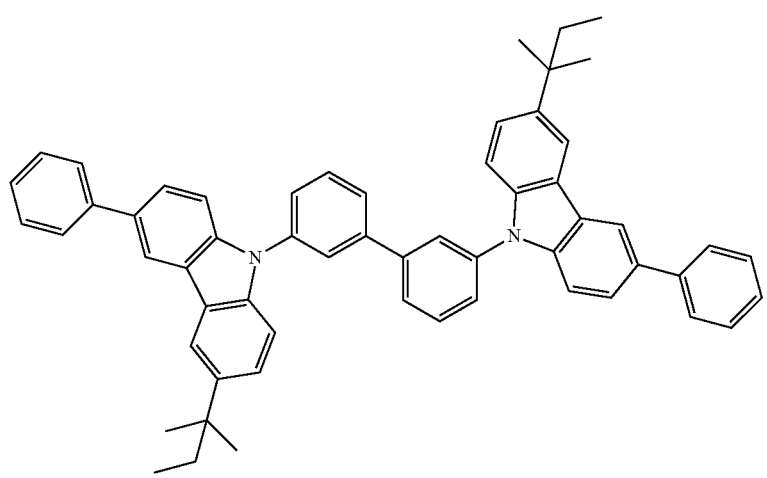

-continued
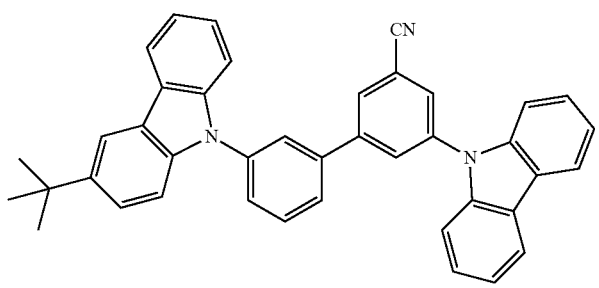
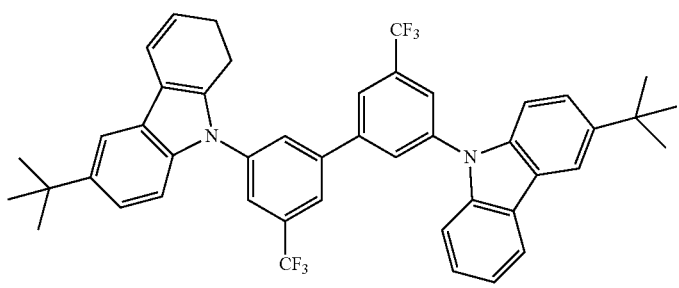
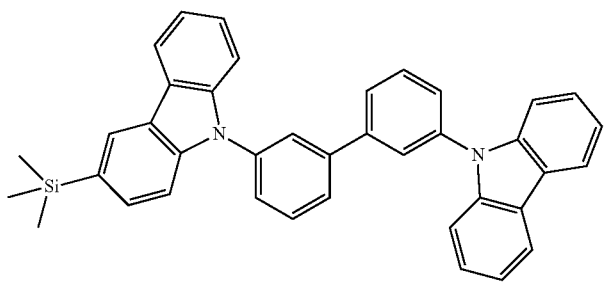
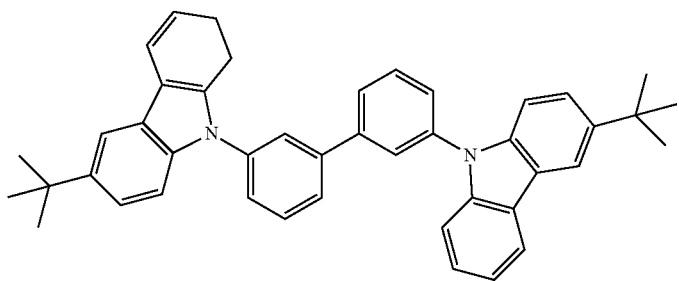
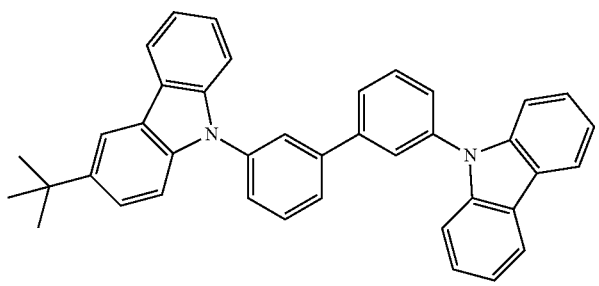

-continued

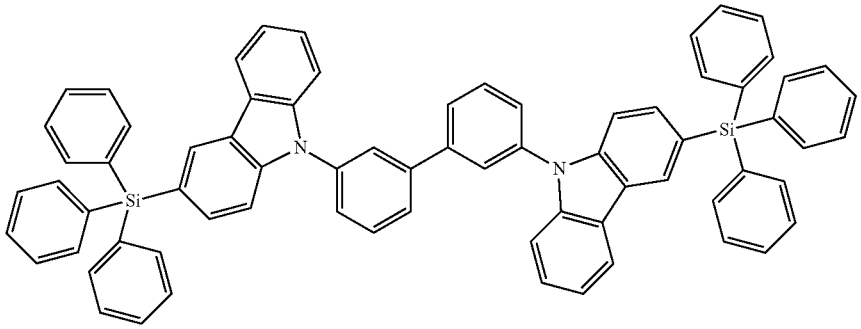

The hole transporting host materials represented by General Formula (3) are not particularly limited and may be appropriately selected depending on the intended purpose. Examples thereof include the following compounds.

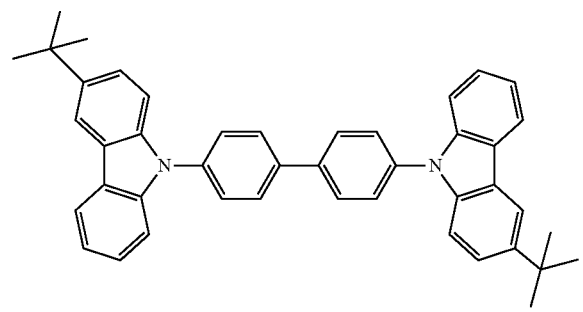

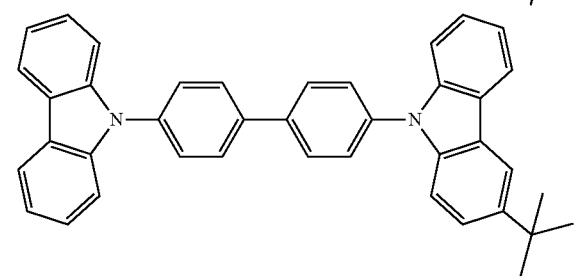

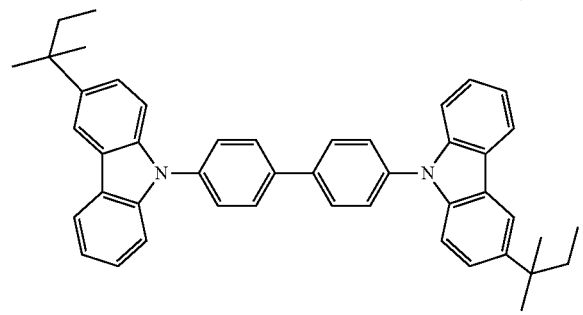

—Hole Transporting Host Material—

The ionization potential Ip of the hole transporting host material is not particularly limited and may be appropriately selected depending on the intended purpose. The ionization potential Ip thereof is preferably 5.1 eV to 6.4 eV, more preferably 5.4 eV to 6.2 eV, particularly preferably 5.6 eV to 6.0 eV, from the viewpoints of improvement in durability and decrease in drive voltage.

The electron affinity Ea of the hole transporting host material is not particularly limited and may be appropriately selected depending on the intended purpose. The electron affinity Ea thereof is preferably 1.2 eV to 3.1 eV, more preferably 1.4 eV to 3.0 eV, particularly preferably 1.8 eV to 2.8 eV, from the viewpoints of improvement in durability and decrease in drive voltage.

The lowest triplet excitation energy (hereinafter may be referred to as "T1") of the hole transporting host material is not particularly limited and may be appropriately selected depending on the intended purpose. The lowest triplet excitation energy thereof is preferably 2.2 eV to 3.7 eV, more preferably 2.4 eV to 3.7 eV, particularly preferably 2.4 eV to 3.4 eV.

The hole transporting host material is not particularly limited and may be appropriately selected depending on the intended purpose. Examples of the hole transporting host material include pyrrole, indole, carbazole, azaindole, azacarbazole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly (N-vinylcarbazole), aniline copolymers, conductive high-molecular-weight oligomers (e.g., thiophene oligomers and polythiophenes), organic silanes, carbon films and derivatives thereof.

Among them, preferred are indole derivatives, carbazole derivatives, azaindole derivatives, azacarbazole derivatives, aromatic tertiary amine compounds and thiophene derivatives. Particularly preferred are compounds having, in their molecule, a plurality of indole skeletons, carbazole skeletons, azaindole skeletons, azacarbazole skeletons or aromatic tertiary amine skeletons.

Also, in the present invention, host materials part or all of the hydrogen atoms of which have been substituted by deuterium may be used (JP-A Nos. 2009-277790 and 2004-515506).

—Hole Injection Material and Hole Transport Material—

Other hole injection materials or hole transport materials used in the hole injection layer or the hole transport layer are not particularly limited and may be appropriately selected depending on the intended purpose. They may be, for example, low-molecular-weight compounds and high-molecular-weight compounds.

The hole injection materials or the hole transport materials are not particularly limited and may be appropriately selected depending on the intended purpose. Examples thereof include pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, phthalocyanine compounds, porphyrin compounds, thiophene derivatives, organosilane derivatives and carbon. These may be use alone or in combination.

In particular, the material for the hole injection layer is preferably high-molecular-weight compounds for the following reasons: (1) high adhesion to the electrode can be obtained to prevent delamination occurring at the interface between the electrode and the organic layer (the hole injection layer) when driving EL and (2) the resultant solution is thickened to prevent aggregation of the phosphorescent light-emitting material.

Of these, arylamine derivatives are preferred. More preferred are compounds having the following Structural Formulas (4) and (5) (Mw=8,000, on the basis of standard polystyrene), PTPDES-2 and PTPDES (these products are of CHEMIPRO KASEI KAISHA, LTD.), a compound having the following Structural Formula (8) (HTL-1 described in U.S. Pat. No. 2008/0220265). The weight average molecular weight of the compound having Structural Formula (4) was calculated through gel permeation chromatography or GPC on the basis of standard polystyrene.

Notably, to prevent excessive mixing between the layers, the layers may have crosslinked portions. The crosslinking method may be any method such as sol-gel crosslinking, radical polymerization, cation polymerization or ring-opening polymerization.

Structural Formula (4)

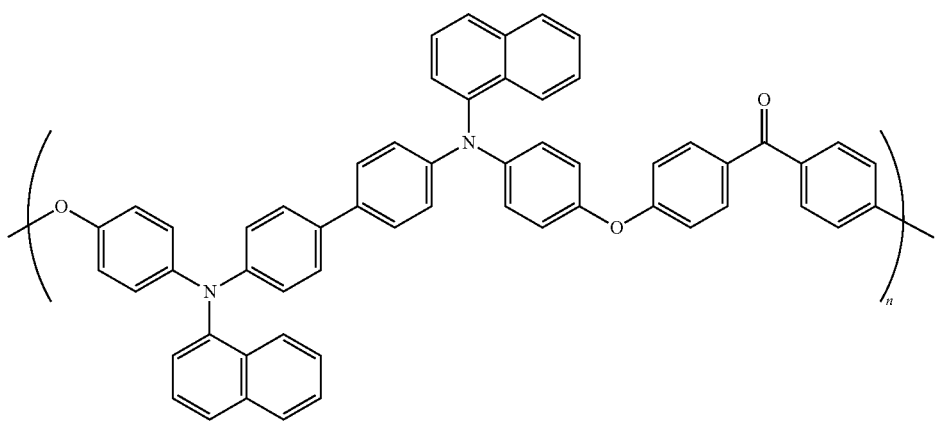

where n is an integer of 1 or greater.

Structural Formula (5)

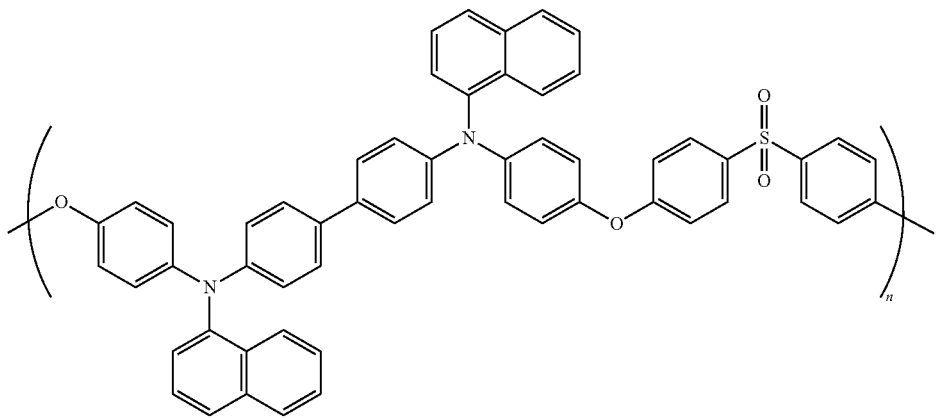

where n is an integer of 1 or greater.

Structural Formula (8)

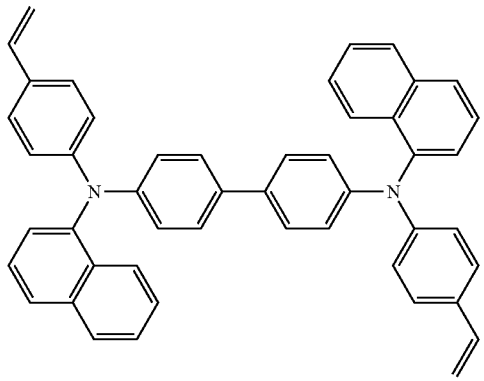

The ionization potential of the arylamine derivative contained in the hole injection layer is not particularly limited and may be appropriately selected depending on the intended purpose. The ionization potential thereof is preferably 4.8 eV to 5.8 eV, more preferably 5.2 eV to 5.8 eV, particularly preferably 5.4 eV to 5.8 eV. When the ionization potential of the arylamine derivative is lower than 4.8 eV and hence lower than that of an ITO electrode, the hole injection barrier to the adjacent hole transport layer may be large. Whereas when the ionization potential of the arylamine derivative is higher than 5.8 eV, the injection barrier to the ITO electrode may be large. When the ionization potential of the arylamine derivative falls within the above particularly preferable range, the injection barrier from the ITO to the hole injection layer becomes small and the injection barrier from the hole injection layer to the hole transport layer becomes also small, which is advantageous in terms of reduction of driving voltage of organic electroluminescence devices.

The difference between the ionization potential of the arylamine derivative contained in the hole injection layer and the ionization potential of the phosphorescent light-emitting material contained in the hole injection layer is not particularly limited and may be appropriately selected depending on the intended purpose. The difference therebetween is preferably within ±0.2 eV. In this case, holes are injected into both the arylamine derivative and the phosphorescent light-emitting material and hence the hole injection layer is improved in conductivity, which is advantageous in terms of improvement in power efficiency of organic electroluminescence devices.

The hole injection layer or the hole transport layer may contain an electron-accepting dopant.

The electron-accepting dopant is not particularly limited and may be appropriately selected depending on the intended purpose. The electron-accepting dopant may be, for example, an inorganic or organic compound, so long as it has electron accepting property and the function of oxidizing an organic compound.

The inorganic compound is not particularly limited and may be appropriately selected depending on the intended purpose. Examples thereof include metal halides (e.g., ferric chloride, aluminum chloride, gallium chloride, indium chloride and antimony pentachloride) and metal oxides (e.g., vanadium pentaoxide and molybdenum trioxide).

The organic compound is not particularly limited and may be appropriately selected depending on the intended purpose. Examples thereof include compounds having a substituent such as a nitro group, a halogen, a cyano group and a trifluoromethyl group; quinone compounds; acid anhydride compounds; and fullerenes.

These electron-accepting dopants may be used alone or in combination.

The amount of the electron-accepting dopant used varies depending on the type of the material. The amount thereof is preferably 0.01% by mass to 50% by mass, more preferably 0.05% by mass to 20% by mass, particularly preferably 0.1% by mass to 10% by mass, relative to the hole transport material or the hole injection material.

The thickness of the hole injection layer or the hole transport layer is not particularly limited and may be appropriately selected depending on the intended purpose. The thickness thereof is preferably 1 nm to 500 nm, more preferably 5 nm to 200 nm, particularly preferably 10 nm to 100 nm.

<<Emission Layer>>

The emission layer is a layer having the functions of receiving holes from the anode, the hole injection layer, or the hole transport layer, and receiving electrons from the cathode, the electron injection layer, or the electron transport layer, and providing a field for recombination of the holes with the electrons for light emission, when an electric field is applied.

The emission layer contains the phosphorescent light-emitting material. The concentration of the phosphorescent light-emitting material contained in the emission layer is lower than that in the hole injection layer and higher than that in the hole transport layer.

The phosphorescent light-emitting material is not particularly limited and may be appropriately selected depending on the intended purpose. The phosphorescent light-emitting material may be, for example, those used in the hole injection layer and the hole transport layer.

The emission layer contains a host material.

The host material is not particularly limited and may be appropriately selected depending on the intended purpose. The host material may be, for example, the hole transporting hosts used in the hole transport layer and the below-described electron transporting host materials.

The ratio by mass of the phosphorescent light-emitting material to the host material in the emission layer (the mass of the phosphorescent light-emitting material/the mass of the host material) is not particularly limited and may be appropriately selected depending on the intended purpose. The ratio by mass of the phosphorescent light-emitting material to the host material in the emission layer is preferably one to ten times, more preferably one to five times the ratio by mass of the phosphorescent light-emitting material to the host material in the hole transport layer (the mass of the phosphorescent light-emitting material/the mass of the host material). When the ratio by mass of the phosphorescent light-emitting material to the host material in the emission layer is less than one time the ratio by mass of the phosphorescent light-emitting material to the host material in the hole transport layer, the hole mobility may be decreased. When the ratio by mass of the phosphorescent light-emitting material to the host material in the emission layer is more than ten times the ratio by mass of the phosphorescent light-emitting material to the host material in the hole transport layer, an excessive amount of holes are injected into the emission layer to accelerate degradation of the adjacent layers, especially the electron transport layer, resulting in that the durability of the organic electroluminescence device may be decreased. When the ratio by mass of the phosphorescent light-emitting material to the host material in the emission layer falls within the above particularly preferable range, the resultant organic electroluminescence device is advantageously improved in power efficiency and durability.

The thickness of the emission layer is not particularly limited and may be appropriately selected depending on the intended purpose. The thickness thereof is preferably 2 nm to 500 nm. From the viewpoint of increasing the external quantum efficiency, the thickness thereof is more preferably 3 nm to 200 nm, particularly preferably 10 nm to 200 nm. The organic emission layer may be a single layer or two or more layers. When it is two or more layers, the layers may emit lights of different colors.

—Electron Transporting Host Material—

The electron affinity Ea of the electron transporting host material is not particularly limited and may be appropriately selected depending on the intended purpose. The electron affinity Ea thereof is preferably 2.5 eV to 3.5 eV, more preferably 2.6 eV to 3.4 eV, further preferably 2.8 eV to 3.3 eV, from the viewpoints of improvement in durability and decrease in drive voltage.

The ionization potential Ip of the electron transporting host material is not particularly limited and may be appropriately selected depending on the intended purpose. The ionization potential Ip thereof is preferably 5.7 eV to 7.5 eV, more preferably 5.8 eV to 7.0 eV, further preferably 5.9 eV to 6.5 eV, from the viewpoints of improvement in durability and decrease in drive voltage.

The lowest triplet excitation energy (hereinafter may be referred to as "T1") of the electron transporting host material is not particularly limited and may be appropriately selected depending on the intended purpose. The lowest triplet excitation energy thereof is preferably 2.2 eV to 3.7 eV, more preferably 2.4 eV to 3.7 eV, particularly preferably 2.4 eV to 3.4 eV.

The electron transporting host material is not particularly limited and may be appropriately selected depending on the intended purpose. Examples thereof include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyradine, fluorine-substituted aromatic compounds, heterocyclic tetracarboxylic anhydrides (e.g., naphthalene and perylene), phthalocyanine, derivatives thereof (which may form a condensed ring with another ring) and various metal complexes such as metal complexes of 8-quinolynol derivatives, metal phthalocyanine, and metal complexes having benzoxazole or benzothiazole as a ligand.

The electron transporting host is not particularly limited and may be appropriately selected depending on the intended purpose. Preferred are metal complexes, azole derivatives (e.g., benzimidazole derivatives and imidazopyridine derivatives) and azine derivatives (e.g., pyridine derivatives, pyrimidine derivatives and triazine derivatives). Among them, metal complexes are more preferred in terms of durability.

The metal complex is not particularly limited and may be appropriately selected depending on the intended purpose. Preferred are metal complexes containing a ligand which has at least one nitrogen atom, oxygen atom, or sulfur atom and which is coordinated with the metal.

The metal ion contained in the metal complex is not particularly limited and may be appropriately selected depending on the intended purpose. It is preferably a beryllium ion, a magnesium ion, an aluminum ion, a gallium ion, a zinc ion, an indium ion, a tin ion, a platinum ion or a palladium ion; more preferably a beryllium ion, an aluminum ion, a gallium ion, a zinc ion, a platinum ion or a palladium ion; particularly preferably an aluminum ion, a zinc ion, a platinum ion or a palladium ion.

The ligand contained in the metal complexes is not particularly limited and may be appropriately selected depending on the intended purpose. Although there are a variety of known ligands, examples thereof include those described in, for example, "Photochemistry and Photophysics of Coordination Compounds" authored by H. Yersin, published by Springer-Verlag Company in 1987; and "YUHKI KINZOKU KAGAKU—KISO TO OUYOU— (Metalorganic Chemistry—Fundamental and Application—)" authored by Akio Yamamoto, published by Shokabo Publishing Co., Ltd. in 1982.

The ligand is not particularly limited and may be appropriately selected depending on the intended purpose. The ligand is preferably nitrogen-containing heterocyclic ligands (preferably having 1 to 30 carbon atoms, more preferably 2 to 20 carbon atoms, particularly preferably 3 to 15 carbon atoms). It may be a unidentate ligand or a bi- or higher-dentate ligand.

The ligand is not particularly limited and may be appropriately selected depending on the intended purpose. Preferred are bi- to hexa-dentate ligands, and mixed ligands of bi- to hexa-dentate ligands with a unidentate ligand.

The ligand is not particularly limited and may be appropriately selected depending on the intended purpose. Examples of the ligand include azine ligands (e.g., pyridine ligands, bipyridyl ligands and terpyridine ligands); hydroxyphenylazole ligands (e.g., hydroxyphenylbenzoimidazole ligands, hydroxyphenylbenzoxazole ligands, hydroxyphenylimidazole ligands and hydroxyphenylimidazopyridine ligands); alkoxy ligands (those having preferably 1 to 30 carbon atoms, more preferably 1 to 20 carbon atoms, particularly preferably 1 to 10 carbon atoms, such as methoxy, ethoxy, butoxy and 2-ethylhexyloxy); and aryloxy ligands (those having preferably 6 to 30 carbon atoms, more preferably 6 to 20 carbon atoms, particularly preferably 6 to 12 carbon atoms, such as phenyloxy, 1-naphthyloxy, 2-naphthyloxy, 2,4,6-trimethylphenyloxy and 4-biphenyloxy), heteroaryloxy ligands (those having preferably 1 to 30 carbon atoms, more preferably 1 to 20 carbon atoms, particularly preferably 1 to 12 carbon atoms, examples of which include pyridyloxy, pyrazyloxy, pyrimidyloxy and quinolyloxy); alkylthio ligands (those having preferably 1 to 30 carbon atoms, more preferably 1 to 20 carbon atoms, particularly preferably 1 to 12 carbon atoms, examples of which include methylthio and ethylthio); arylthio ligands (those having preferably 6 to 30 carbon atoms, more preferably 6 to 20 carbon atoms, particularly preferably 6 to 12 carbon atoms, examples of which include phenylthio); heteroarylthio ligands (those having preferably 1 to 30 carbon atoms, more preferably 1 to 20 carbon atoms, particularly preferably 1 to 12 carbon atoms, examples of which include pyridylthio, 2-benzimidazolylthio, 2-benzoxazolylthio and 2-benzothiazolylthio); siloxy ligands (those having preferably 1 to 30 carbon atoms, more preferably 3 to 25 carbon atoms, particularly preferably 6 to 20 carbon atoms, examples of which include a triphenylsiloxy group, a triethoxysiloxy group and a triisopropylsiloxy group); aromatic hydrocarbon anion ligands (those having preferably 6 to 30 carbon atoms, more preferably 6 to 25 carbon atoms, particularly preferably 6 to 20 carbon atoms, examples of which include a phenyl anion, a naphthyl anion and an anthranyl anion); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion and a benzothiophene anion); and indolenine anion ligands.

Among them, nitrogen-containing heterocyclic ligands, aryloxy ligands, heteroaryloxy groups, siloxy ligands, etc. are more preferred, and nitrogen-containing heterocyclic ligands, aryloxy ligands, siloxy ligands, aromatic hydrocarbon anion ligands, aromatic heterocyclic anion ligands, etc. are particularly preferred.

The metal complexes used for the electron transporting host material are compounds described in, for example, JP-A Nos. 2002-235076, 2004-214179, 2004-221062, 2004-221065, 2004-221068 and 2004-327313.

<<Other Layers>>

The other layers are not particularly limited and may be appropriately selected depending on the intended purpose. Examples thereof include an electron transport layer, an electron injection layer, a hole blocking layer and an electron blocking layer.

—Electron Transport Layer and Electron Injection Layer—

The electron injection layer or the electron transport layer is a layer having the function of receiving electrons from the cathode or from the cathode side and transporting the electrons to the anode side.

The thickness of the electron injection layer or the electron transport layer is not particularly limited and may be appropriately selected depending on the intended purpose. The thickness thereof is preferably 0.5 nm to 500 nm, more preferably 1 nm to 200 nm.

The electron injection layer or the electron transport layer is not particularly limited and may be appropriately selected depending on the intended purpose. The electron injection layer or the electron transport layer preferably contains a reducing dopant.

The reducing dopant is not particularly limited and may be appropriately selected depending on the intended purpose. The reducing dopant is preferably at least one selected from alkali metals, alkaline-earth metals, rare-earth metals, alkali metal oxides, alkali metal halides, alkaline-earth metal oxides, alkaline-earth metal halides, rare-earth metal oxides, rare-earth metal halides, alkali metal organic complexes, alkaline-earth metal organic complexes and rare-earth metal organic complexes.

The amount of the reducing dopant used varies depending on the type of the material. The amount thereof is preferably 0.1% by mass to 99% by mass, more preferably 0.3% by mass to 80% by mass, particularly preferably 0.5% by mass to 50% by mass, relative to the electron transport material or the electron injection material.

The electron transport layer and the electron injection layer are not particularly limited and can be formed by a known method. Specifically, suitably employed methods include a deposition method, a wet film forming method, a molecular beam epitaxial or MBE method, a cluster ion beam method, a molecule deposition method, an LB method, a coating method and a printing method.

The thickness of the electron transport layer is not particularly limited and may be appropriately selected depending on the intended purpose. The thickness thereof is preferably 1 nm to 200 nm, more preferably 1 nm to 100 nm, particularly preferably 1 nm to 50 nm.

The thickness of the electron injection layer is not particularly limited and may be appropriately selected depending on the intended purpose. The thickness thereof is preferably 1 nm to 200 nm, more preferably 1 nm to 100 nm, particularly preferably 1 nm to 50 nm.

—Hole Blocking Layer and Electron Blocking Layer—

The hole blocking layer is a layer having the function of preventing the holes, which have been transported from the anode side to the emission layer, from passing toward the cathode side, and is generally provided as an organic compound layer adjacent to the emission layer on the cathode side.

The electron blocking layer is a layer having the function of preventing the electrons, which have been transported from the cathode side to the emission layer, from passing toward the anode side, and is generally provided as an organic compound layer adjacent to the emission layer on the anode side.

The compound for the hole blocking layer is not particularly limited and may be appropriately selected depending on the intended purpose. Examples thereof include aluminum complexes (e.g., BAlq), triazole derivatives and phenanthroline derivatives (e.g., BCP).

The compound for the electron blocking layer is not particularly limited and may be appropriately selected depending on the intended purpose. Examples of the compound employable include the above-described hole transport materials.

The electron blocking layer and the hole blocking layer are not particularly limited and can be formed by a known method. Specifically, suitably employed methods include a dry film forming method such as a sputtering method or a deposition method, a wet coating method, a transfer method, a printing method and an inkjet method.

The thickness of the hole blocking layer or the electron blocking layer is not particularly limited and may be appropriately selected depending on the intended purpose. The thickness thereof is preferably 1 nm to 200 nm, more preferably 1 nm to 50 nm, particularly preferably 3 nm to 10 nm. The hole blocking layer or the electron blocking layer may have a single-layered structure made of one or more of the above-mentioned materials, or a multi-layered structure made of a plurality of layers which are identical or different in composition.

<Electrode>

The organic electroluminescence device of the present invention includes a pair of electrodes; i.e., an anode and a cathode. In terms of the function of the organic electroluminescence device, at least one of the anode and the cathode is preferably transparent. In general, the anode may be any material, so long as it has the function of serving as an electrode which supplies holes to the organic compound layer.

The shape, structure, size, etc. thereof are not particularly limited and may be appropriately selected from known electrode materials depending on the intended application/purpose of the organic electroluminescence device.

The material for the electrodes is not particularly limited and may be appropriately selected depending on the intended purpose. Preferred examples of the material include metals, alloys, metal oxides, conductive compounds and mixtures thereof.

<<Anode>>

The material for the anode is not particularly limited and may be appropriately selected depending on the intended purpose. Examples thereof include conductive metal oxides such as tin oxides doped with, for example, antimony and fluorine (ATO and FTO), tin oxide, zinc oxide, indium oxide, indium tin oxide (ITO) and indium zinc oxide (IZO); metals such as gold, silver, chromium and nickel; mixtures or laminates of these metals and the conductive metal oxides; inorganic conductive materials such as copper iodide and copper sulfide; organic conductive materials such as polyaniline, polythiophene and polypyrrole; and laminates of these materials and ITO. Among them, conductive metal oxides are preferred. In particular, ITO is preferred from the viewpoints of productivity, high conductivity, transparency, etc.

<<Cathode>>

The material for the cathode is not particularly limited and may be appropriately selected depending on the intended purpose. Examples thereof include alkali metals (e.g., Li, Na, K and Cs), alkaline earth metals (e.g., Mg and Ca), gold, silver, lead, aluminum, sodium-potassium alloys, lithium-aluminum alloys, magnesium-silver alloys and rare earth metals (e.g., indium and ytterbium). These may be used alone, but it is preferred that two or more of them are used in combination from the viewpoint of satisfying both stability and electron-injection property.

Among them, as the materials for forming the cathode, alkali metals or alkaline earth metals are preferred in terms of excellent electron-injection property, and materials containing aluminum as a major component are preferred in terms of excellent storage stability.

The term "material containing aluminum as a major component" refers to a material composed of aluminum alone; alloys containing aluminum and 0.01% by mass to 10% by mass of an alkali or alkaline earth metal; or the mixtures thereof (e.g., lithium-aluminum alloys and magnesium-aluminum alloys).

The method for forming the electrodes is not particularly limited and may be a known method. Examples thereof include wet methods such as printing methods and coating methods; physical methods such as vacuum deposition methods, sputtering methods and ion plating methods; and chemical methods such as CVD and plasma CVD methods. The electrodes can be formed on a substrate by a method appropriately selected from the above methods in consideration of their suitability to the material for the electrodes. For example, when ITO is used as the material for the anode, the anode may be formed in accordance with a DC or high-frequency sputtering method, a vacuum deposition method, or an ion plating method. For example, when a metal (or metals) is (are) selected as the material (or materials) for the cathode, one or more of them may be applied simultaneously or sequentially by, for example, a sputtering method.

Patterning for forming the electrodes may be performed by a chemical etching method such as photolithography; a physical etching method such as etching by laser; a method of vacuum deposition or sputtering using a mask; a lift-off method; or a printing method.

<Substrate>

The organic electroluminescence device of the present invention is preferably formed on a substrate. It may be formed so that a substrate comes into direct contact with the electrodes, or may be formed on a substrate by the mediation of an intermediate layer.

The material for the substrate is not particularly limited and may be appropriately selected depending on the intended purpose. Examples thereof include inorganic materials such as yttria-stabilized zirconia (YSZ) and glass (alkali-free glass and soda-lime glass); and organic materials such as polyesters (e.g., polyethylene terephthalate, polybutylene phthalate and polyethylene naphthalate), polystyrene, polycarbonate, polyether sulfone, polyarylate, polyimide, polycycloolefin, norbornene resins and poly(chlorotrifluoroethylene).

The shape, structure, size, etc. of the substrate are not particularly limited and may be appropriately selected depending on, for example, the intended application/purpose of the light-emitting device. In general, the substrate is preferably a sheet. The substrate may have a single- or multi-layered structure, and may be a single member or a combination of two or more members. The substrate may be opaque, colorless transparent, or colored transparent.

The substrate may be provided with a moisture permeation-preventing layer (gas barrier layer) on the front or back surface thereof.

The moisture permeation-preventing layer (gas barrier layer) is preferably made from an inorganic compound such as silicon nitride and silicon oxide.

The moisture permeation-preventing layer (gas barrier layer) may be formed through, for example, high-frequency sputtering.

<Protective Layer>

The organic electroluminescence device of the present invention may be entirely protected with a protective layer.

The material contained in the protective layer may be any materials, so long as they have the function of preventing permeation of water, oxygen, etc., which promote degradation of the device. Examples thereof include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal nitrides such as $SiN_x$ and $SiN_xO_y$; metal fluorides such as $MgF_2$, LiF, $AlF_3$ and $CaF_2$; polyethylenes, polypropylenes, polymethyl methacrylates, polyimides, polyureas, polytetrafluoroethylenes, polychlorotrifluoroethylens, polydichlorofluoroethylenes, copolymers of chlorotrifluoroethylens and dichlorodifluoroethylenes, copolymers produced through compolymerization of a monomer mixture containing tetrafluoroethylene and at least one comonomer, fluorine-containing copolymers containing a ring structure in the copolymerization main chain, water-absorbing materials each having a water absorption rate of 1% or more, and moisture permeation preventive substances each having a water absorption rate of 0.1% or less.

The method for forming the protective layer is not particularly limited and may be appropriately selected depending on the intended purpose. Examples thereof include a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method and a transfer method.

<Seal Container>

The organic electroluminescence device of the present invention may be entirely sealed with a seal container. Moreover, a moisture absorber or an inert liquid may be incorporated into the space between the seal container and the organic electroluminescence device.

The moisture absorber is not particularly limited and may be appropriately selected depending on the intended purpose. Examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite and magnesium oxide.

Also, the inert liquid is not particularly limited and may be appropriately selected depending on the intended purpose. Examples thereof include paraffins; liquid paraffins; fluorine-based solvents such as perfluoroalkanes, perfluoroamines and perfluoroethers; chlorinated solvents; and silicone oils.

<Resin Seal Layer>

The organic electroluminescence device of the present invention is preferably sealed with a resin seal layer to prevent degradation of its performance due to oxygen or water contained in the air.

The resin material for the resin seal layer is not particularly limited and may be appropriately selected depending on the intended purpose. Examples thereof include acrylic resins, epoxy resins, fluorine-containing resins, silicone resins, rubber resins and ester resins. Among them, epoxy resins are preferred from the viewpoint of preventing water permeation. Among the epoxy resins, thermosetting epoxy resins and photo-curable epoxy resins are preferred.

The forming method for the resin seal layer is not particularly limited and may be appropriately selected depending on the intended purpose. Examples thereof include a method by coating a resin solution, a method by pressbonding or hot press-bonding a resin sheet, and a method by polymerizing under dry conditions (e.g., vapor deposition and sputtering).

<Sealing Adhesive>

The organic electroluminescence device may contain a sealing adhesive having the function of preventing permeation of moisture or oxygen from the edges thereof.

The material for the sealing adhesive may be those used in the resin seal layer. Among them, epoxy resins are preferred from the viewpoint of preventing water permeation. Among the epoxy resins, photo-curable epoxy adhesives and thermosetting epoxy adhesives are preferred.

Also, a filler is preferably added to the sealing adhesive. The filler is not particularly limited and may be appropriately selected depending on the intended purpose. The filler is preferably inorganic materials such as $SiO_2$, SiO (silicon oxide), SiON (silicon oxynitride) and SiN (silicon nitride). The addition of the filler increases the viscosity of the sealing adhesive to improve production suitability and humidity resistance.

The sealing adhesive may also contain a desiccant. The desiccant is not particularly limited and may be appropriately selected depending on the intended purpose. Examples thereof include barium oxide, calcium oxide or strontium oxide. The amount of the desiccant added to the sealing adhesive is preferably 0.01% by mass to 20% by mass, more preferably 0.05% by mass to 15% by mass. When the amount is less than 0.01% by mass, the desiccant exhibits reduced effects. Whereas when the amount is more than 20% by mass, it is difficult to homogeneously disperse the desiccant in the sealing adhesive, which is not preferred.

In the present invention, the sealing adhesive containing the desiccant is applied in a predetermined amount using, for example, a dispenser. Thereafter, a second substrate is overlaid, followed by curing for sealing.

Figure 5:
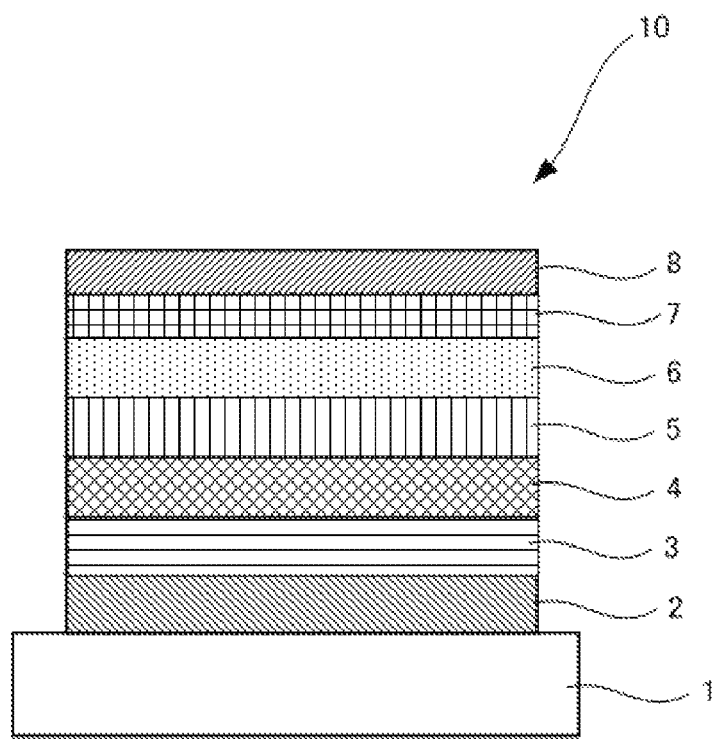
FIG. 5 is a schematic view of one exemplary layer structure of an organic electroluminescence device of the present invention.

FIG. 5 is a schematic view of one exemplary layer structure of the organic electroluminescence device of the present invention. An organic electroluminescence device 10 has a layer structure in which a glass substrate 1 and an anode 2 (e.g., an ITO electrode), a hole injection layer 3, a hole transport layer 4, an emission layer 5, an electron transport layer 6, an electron injection layer 7 (e.g., a lithium fluoride-containing layer), a cathode 8 (e.g., an Al—Li electrode) disposed on the glass substrate in this order. Notably, the anode 2 (e.g., the ITO electrode) and the cathode 8 (e.g., the Al—Li electrode) are connected together via a power source.

—Driving—

The organic electroluminescence device can emit light when a DC voltage (which, if necessary, contains AC components) (generally 2 volts to 15 volts) or a DC is applied to between the anode and the cathode.

The organic electroluminescence device of the present invention can be applied to an active matrix using a thin film transistor (TFT). An active layer of the thin film transistor may be made from, for example, amorphous silicon, high-temperature polysilicon, low-temperature polysilicon, microcrystalline silicon, oxide semiconductor, organic semiconductor and carbon nanotube.

The thin film transistor used for the organic electroluminescence device of the present invention may be those described in, for example, International Publication No. WO2005/088726, JP-A No. 2006-165529 and U.S. Pat. Application Publication No. 2008/0237598 A1.

The organic electroluminescence device of the present invention is not particularly limited. In the organic electroluminescence device, the light-extraction efficiency can be further improved by various known methods. It is possible to increase the light-extraction efficiency to improve the external quantum efficiency, for example, by processing the surface shape of the substrate (for example, by forming a fine concavo-convex pattern), by controlling the refractive index of the substrate, the ITO layer and/or the organic layer, or by controlling the thickness of the substrate, the ITO layer and/or the organic layer.

The manner in which light is extracted from the organic electroluminescence device of the present invention may be top-emission or bottom-emission.

The organic electroluminescence device may have a resonator structure. For example, on a transparent substrate are stacked a multi-layered film mirror composed of a plurality of laminated films having different refractive indices, a transparent or semi-transparent electrode, an emission layer and a metal electrode. The light generated in the emission layer is repeatedly reflected between the multi-layered film mirror and the metal electrode (which serve as reflection plates); i.e., is resonated.

In another preferred embodiment, a transparent or semi-transparent electrode and a metal electrode are stacked on a transparent substrate. In this structure, the light generated in the emission layer is repeatedly reflected between the transparent or semi-transparent electrode and the metal electrode (which serve as reflection plates); i.e., is resonated.

For forming the resonance structure, an optical path length determined based on the effective refractive index of two reflection plates, and on the refractive index and the thickness of each of the layers between the reflection plates is adjusted to be an optimal value for obtaining a desired resonance wavelength. The calculation formula applied in the case of the first embodiment is described in JP-A No. 09-180883. The calculation formula in the case of the second embodiment is described in JP-A No. 2004-127795.

—Application—

The application of the organic electroluminescence device of the present invention is not particularly limited and may be appropriately selected depending on the intended purpose. The organic electroluminescence device can be suitably used in, for example, display devices, displays, backlights, electrophotography, illuminating light sources, recording light sources, exposing light sources, reading light sources, markers, interior accessories and optical communication.

As a method for forming a full color-type display, there are known, for example, as described in "Monthly Display," September 2000, pp. 33 to 37, a tricolor light emission method by arranging, on a substrate, organic electroluminescence devices corresponding to three primary colors (blue color (B), green color (G) and red color (R)); a white color method by separating white light emitted from an organic electroluminescence device for white color emission into three primary colors through a color filter; and a color conversion method by converting a blue light emitted from an organic electroluminescence device for blue light emission into red color (R) and green color (G) through a fluorescent dye layer. Further, by combining a plurality of organic electroluminescence devices emitting lights of different colors which are obtained by the above-described methods, plane-type light sources emitting lights of desired colors can be obtained. For example, there are exemplified white light-emitting sources obtained by combining blue and yellow light-emitting devices, and white light-emitting sources obtained by combining blue, green and red light-emitting devices.

(Method for Producing an Organic Electroluminescence Device)

A method for producing an organic electroluminescence device of the present invention includes at least a hole injection layer-forming step, a hole transport layer-forming step and an emission layer-forming step; and, if necessary, further includes appropriately selected other steps.

<Hole Injection Layer-Forming Step>

The hole injection layer-forming step is a step of forming the hole injection layer.

The method for forming the hole injection layer is not particularly limited and may be appropriately selected depending on the intended purpose. Examples thereof include dry film forming methods such as a deposition method and a sputtering method, wet coating methods (a slit coating method and a spin coating method), transfer methods, printing methods and inkjet methods.

Of these, wet coating methods are preferred from the viewpoints of efficiently utilizing materials and covering irregularities in the electrode surface.

<Hole Transport Layer-Forming Step>

The hole transport layer-forming step is a step of forming the hole transport layer.

The method for forming the hole transport layer is not particularly limited and may be appropriately selected depending on the intended purpose. Examples thereof include dry film forming methods such as a deposition method and a sputtering method, wet coating methods (a slit coating method and a spin coating method), transfer methods, printing methods and inkjet methods.

Of these, wet coating methods are preferred from the viewpoint of efficiently utilizing materials.

<Emission Layer-Forming Step>

The emission layer-forming step is a step of forming the emission layer.

The method for forming the emission layer is not particularly limited and may be appropriately selected depending on the intended purpose. Examples thereof include dry film forming methods such as a deposition method and a sputtering method, wet coating methods (a slit coating method and a spin coating method), transfer methods, printing methods and inkjet methods.

Of these, wet coating methods are preferably employed, since the concentration of the phosphorescent light-emitting material or the host material contained in the hole transport layer can be changed from an interface between the hole transport layer and the emission layer to an interface between the hole transport layer and the hole injection layer.

<Other Steps>

The other steps are not particularly limited and may be appropriately selected depending on the intended purpose. Examples thereof include an electron transport layer-forming step, an electron injection layer-forming step, a hole blocking layer-forming step and an electron blocking layer-forming step.

EXAMPLES

The present invention will next be described by way of Examples, which should not be construed as limiting the present invention thereto.

Notably, in Examples and Comparative Examples, unless otherwise specified, the deposition rate was 0.2 nm/sec. The deposition rate was measured with a quartz crystal unit. Also, the layer thicknesses given below were measured with a quartz crystal unit.

Example 1

Production of Organic Electroluminescence Device

A glass substrate (thickness: 0.7 mm, 25 mm×25 mm) was placed in a washing container. The substrate was washed in 2-propanol through ultrasonication, and then was UV-ozone treated for 30 min. The following layers were formed on this glass substrate.

First, ITO (Indium Tin Oxide) was deposited through sputtering on the glass substrate so as to form a 150 nm-thick anode. The obtained transparent supporting substrate was etched and washed.

Next, the anode (ITO) was coated through spin coating with a coating liquid which had been prepared by dissolving or dispersing 14 parts by mass of arylamine derivative (trade name: PTPDES-2, product of CHEMIPRO KASEI KAISHA, LTD., ionization potential (Ip)=5.45 eV) and 6 parts by mass of a compound having Structural Formula (2) serving as a phosphorescent light-emitting material (ionization potential (Ip)=5.34 eV) in 980 parts by mass of cyclohexanone for electronics industry (product of KANTO KAGAKU). The resultant product was dried at 120° C. for 30 min and then annealed at 160° C. for 10 min, to thereby form a hole injection layer having a thickness of about 40 nm.

Next, the hole injection layer was coated through spin coating with a coating liquid which had been prepared by dissolving or dispersing 4 parts by mass of a compound having Structural Formula (4) (arylamine derivative) (Mw=8,000) in 996 parts by mass of xylene for electronics industry (product of KANTO KAGAKU). The obtained product was dried at 120° C. for 30 min and then annealed at 150° C. for 10 min, to thereby form a hole transport layer having a thickness of about 10 nm.

Notably, spin coating for the hole injection layer or the hole transport layer was performed in a glove box (dew point: −68° C., oxygen concentration: 10 ppm).

Next, the compound having Structural Formula (2), serving as the phosphorescent light-emitting material, and a compound having Structural Formula (6), serving as the host material, were co-deposited at a ratio by mass of 10:90 on the hole transport layer by a vacuum deposition method, to thereby form an emission layer having a thickness of 40 nm.

Structural Formula (6)

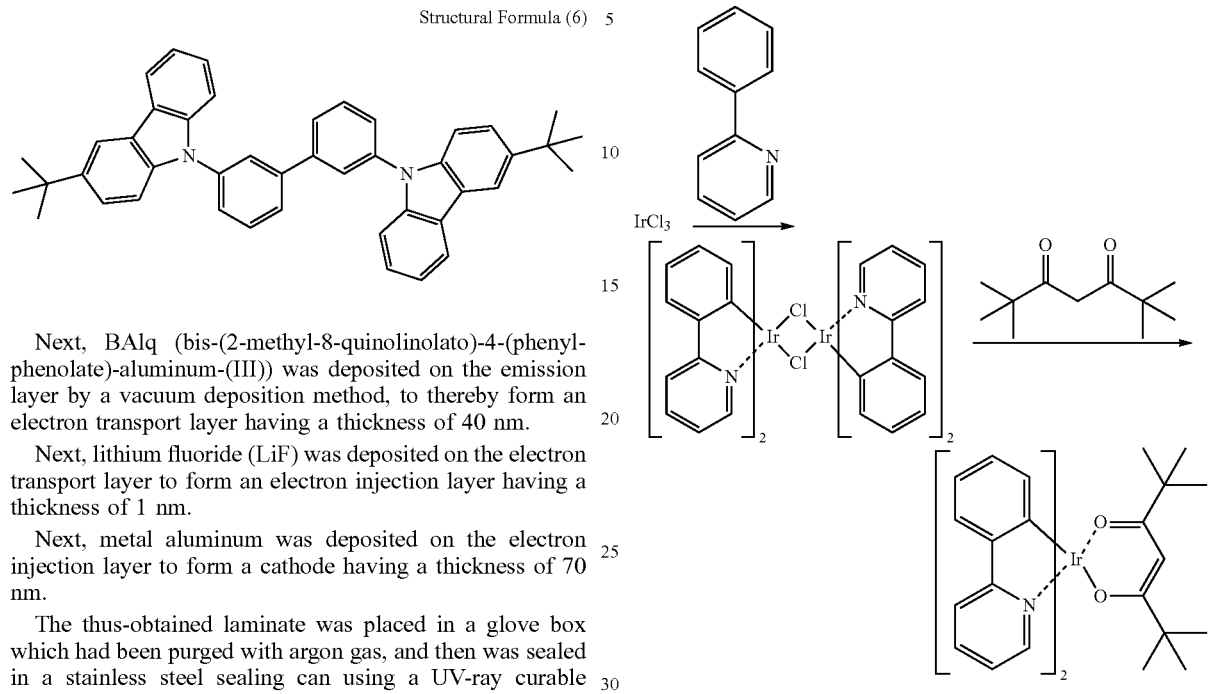

Next, BAlq (bis-(2-methyl-8-quinolinolato)-4-(phenyl-phenolate)-aluminum-(III)) was deposited on the emission layer by a vacuum deposition method, to thereby form an electron transport layer having a thickness of 40 nm.

Next, lithium fluoride (LiF) was deposited on the electron transport layer to form an electron injection layer having a thickness of 1 nm.

Next, metal aluminum was deposited on the electron injection layer to form a cathode having a thickness of 70 nm.

The thus-obtained laminate was placed in a glove box which had been purged with argon gas, and then was sealed in a stainless steel sealing can using a UV-ray curable adhesive (XNR5516HV, product of Nagase-CIBA Ltd.).

The synthesis schemes of the compounds having Structural Formulas (2), (4) and (6) are as follows.

<Synthesis Scheme of the Compound Having Structural Formula (2)>

<Synthesis Scheme of the Compound Having Structural Formula (4)>

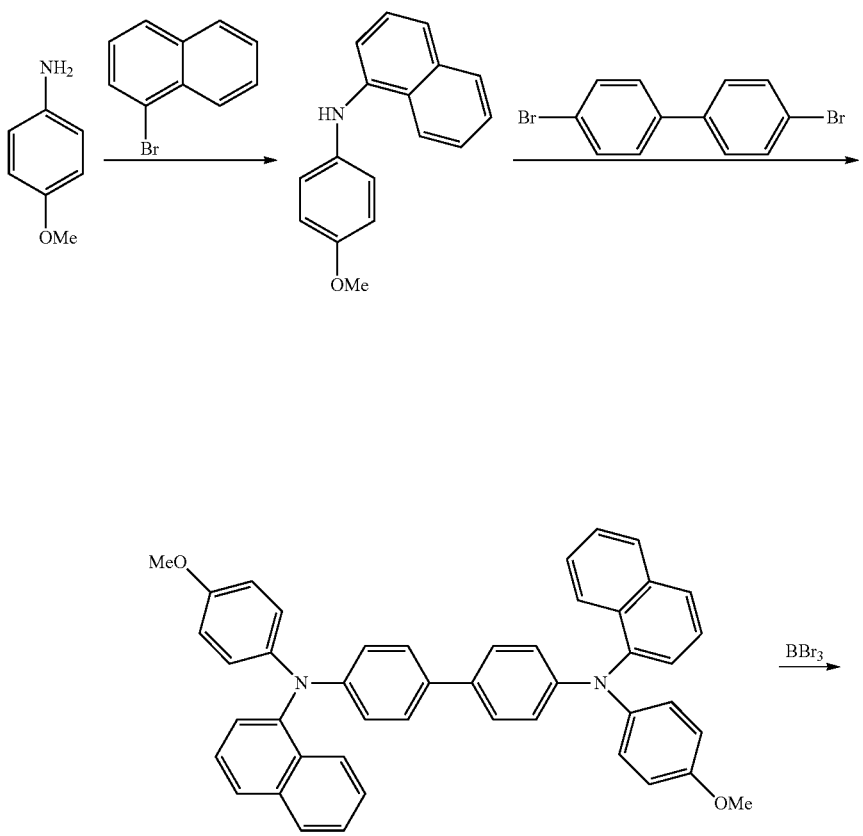

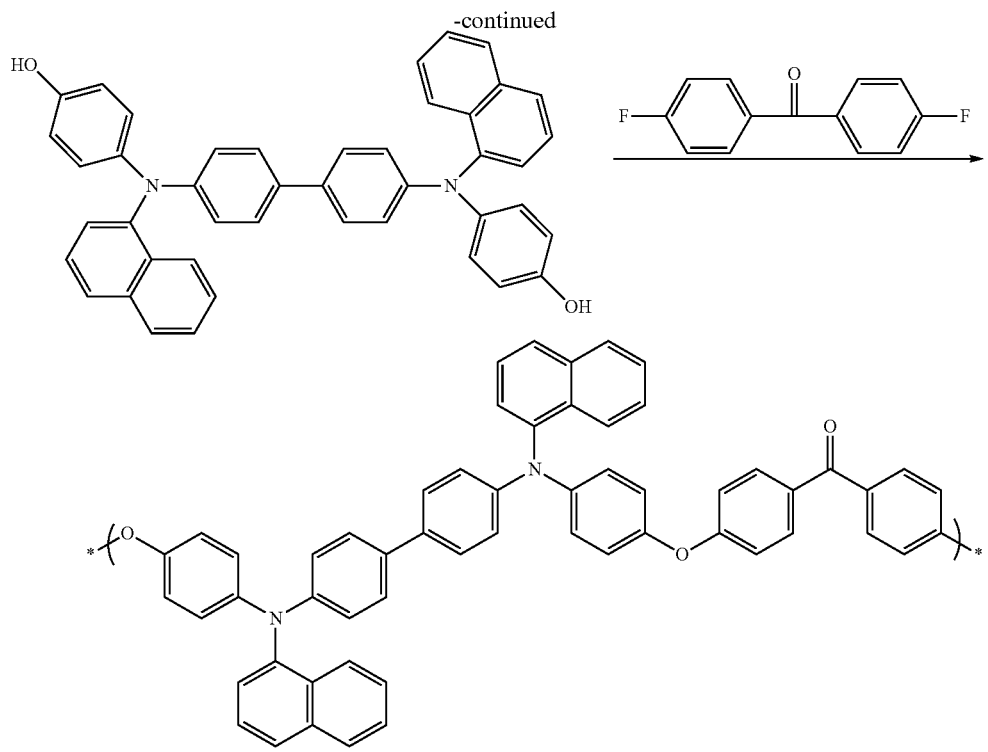

<Synthesis Scheme of the Compound Having Structural Formula (6)>

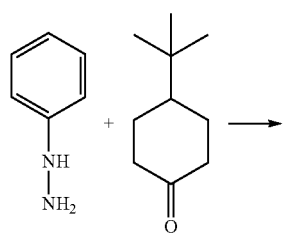

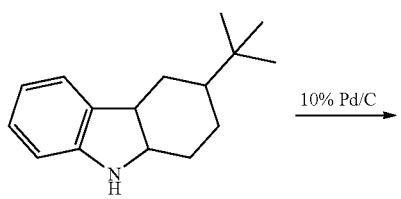

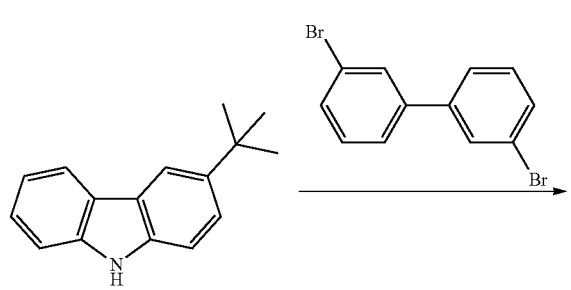

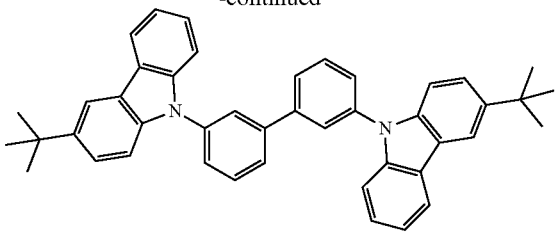

Example 2

An organic electroluminescence device was produced in the same manner as in Example 1, except that the hole transport layer was formed using a coating liquid which had been prepared by dissolving or dispersing 10.4 parts by mass of the compound having Structural Formula (4) (as the arylamine derivative) (Mw=8,000), 0.26 parts by mass of the compound having Structural Formula (2) (as the phosphorescent light-emitting material) and 2.34 parts by mass of the compound having Structural Formula (6) (as the host material) in 987 parts by mass of xylene for electronics industry (product of KANTO KAGAKU).

Example 3

An organic electroluminescence device was produced in the same manner as in Example 2, except that an emission layer (thickness: 35 nm) was formed in a glove box through spin coating of an emission layer-coating liquid, followed by drying at 100° C. for 30 min. Here, the emission layer-coating liquid was formed as follows. Specifically, 1 part by mass of the compound having Structural Formula (2) (as the phosphorescent light-emitting material) and 9 parts by mass of the compound having Structural Formula (6) (as the host material) were dissolved or dispersed in 990 parts by mass of 2-butanone for electronics industry (product of KANTO KAGAKU). Then, molecular sieve (trade name: molecular sieve 5A 1/16, product of Wako Pure Chemical Industries, Ltd.) was added to the resultant mixture, followed by filtration with a syringe filter (pore size: 0.22 μm) in the glove box.

Figure 6:
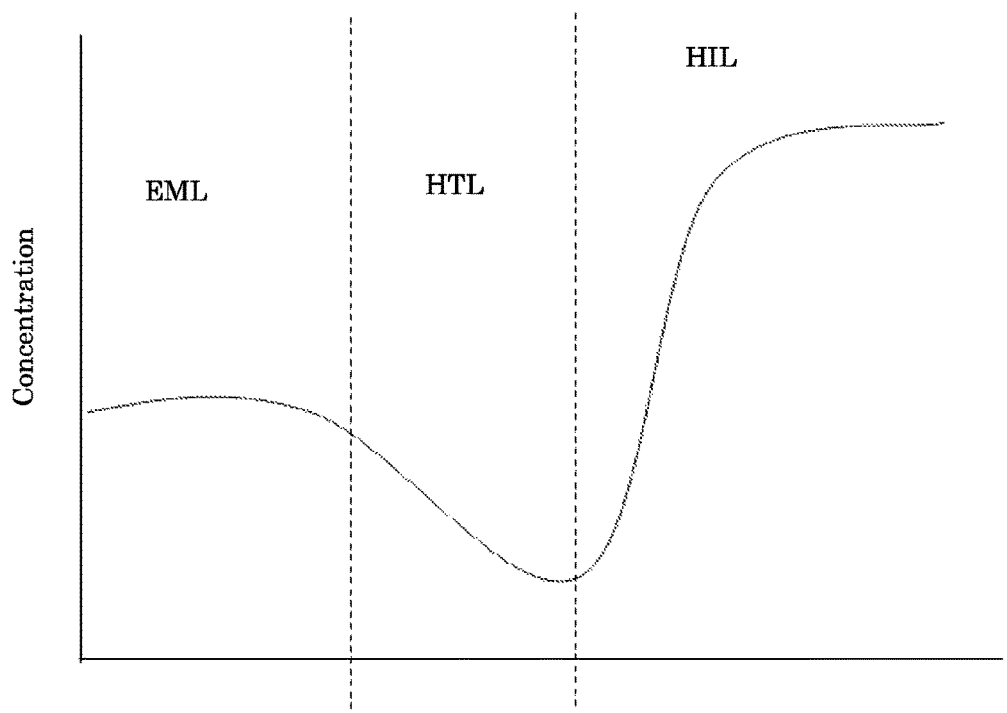
FIG. 6 is a graph showing the Ir concentration (profile of film thickness) contained in a hole injection layer, a hole transport layer and an emission layer of an organic electroluminescence device of Example 3.

Through X-ray photoelectron spectroscopy of the laminate including the hole transport layer and the emission layer formed thereon by coating, the concentration of the Ir complex was found to be gradually decreased in the hole transport layer from an interface between the hole transport layer and the emission layer to an interface between the hole transport layer and the hole injection layer (FIG. 6).

Example 4

An organic electroluminescence device was produced in the same manner as in Example 1, except that the hole transport layer was formed using a coating liquid which had been prepared by dissolving or dispersing 12.74 parts by mass of the compound having Structural Formula (4) (Mw=8,000) (as the arylamine derivative) and 0.26 parts by mass of the compound having Structural Formula (2) (as the phosphorescent light-emitting material) in 987 parts by mass of xylene for electronics industry (product of KANTO KAGAKU).

Example 5

An organic electroluminescence device was produced in the same manner as in Example 1, except that the hole injection layer was formed through spin coating of a coating liquid which had been prepared by dissolving or dispersing 11 parts by mass of PTPDES-2 (as the arylamine derivative) and 9 parts by mass of the compound having Structural Formula (2) (as the phosphorescent light-emitting material) in 980 parts by mass of cyclohexane for electronics industry (product of KANTO KAGAKU) and the hole transport layer was formed using a coating liquid which had been prepared by dissolving or dispersing 12.61 parts by mass of the compound having Structural Formula (4) (as the arylamine derivative) and 0.39 parts by mass of the compound having Structural Formula (2) (as the phosphorescent light-emitting material) in 987 parts by mass of xylene for electronics industry (product of KANTO KAGAKU).

Example 6

An organic electroluminescence device was produced in the same manner as in Example 2, except that the compound having the following Structural Formula (1) (trade name: Ir(ppy)$_3$, product of CHEMIPRO KASEI KAISHA, LTD.) (the phosphorescent light-emitting material) was used for the formation of the hole injection layer and the hole transport layer.

Structural Formula (1)

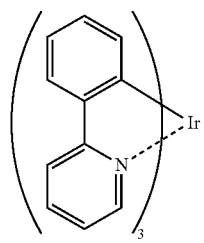

Example 7

An organic electroluminescence device was produced in the same manner as in Example 2, except that Firpic (iridium(III) bis(4,6-difluorophenylpyridinato)picolate) (product of CHEMIPRO KASEI KAISHA, LTD, ionization potential (Ip)=5.8 eV) (the phosphorescent light-emitting material) was used for the formation of the hole injection layer and the hole transport layer.

Comparative Example 1

An organic electroluminescence device was produced in the same manner as in Example 1, except that no phosphorescent light-emitting material was added to the coating liquid used for the formation of the hole injection layer.

Comparative Example 2

An organic electroluminescence device was produced in the same manner as in Example 2, except that no phosphorescent light-emitting material was added to the coating liquid used for the formation of the hole injection layer.

Comparative Example 3

An organic electroluminescence device was produced in the same manner as in Example 1, except that the hole injection layer was formed using a coating liquid which had been prepared by dissolving or dispersing 4 parts by mass of PTPDES-2 (as the arylamine derivative) and 16 parts by mass of the compound having Structural Formula (2) (as the phosphorescent light-emitting material) in 980 parts by mass of cyclohexanone for electronics industry (product of KANTO KAGAKU).

Comparative Example 4

An organic electroluminescence device was produced in the same manner as in Example 1, except that the hole injection layer was formed using a coating liquid which had been prepared by dissolving or dispersing 9 parts by mass of PTPDES-2 (as the arylamine derivative) and 11 parts by mass of the compound having Structural Formula (2) (as the phosphorescent light-emitting material) in 980 parts by mass of xylene for electronics industry (product of KANTO KAGAKU).

Example 8

An organic electroluminescence device was produced in the same manner as in Example 1, except that the hole injection layer was formed using a coating liquid which had been prepared by dissolving or dispersing 17.8 parts by mass of PTPDES-2 (as the arylamine derivative) and 2.2 parts by mass of the compound having Structural Formula (2) (as the phosphorescent light-emitting material) in 980 parts by mass of cyclohexane for electronics industry (product of KANTO KAGAKU).

Example 9

An organic electroluminescence device was produced in the same manner as in Example 1, except that the hole injection layer was formed using a coating liquid which had been prepared by dissolving or dispersing 7.2 parts by mass of PTPDES-2 (as the arylamine derivative), 3 parts by mass of S-320 (crosslinking agent, product of AZmax. co) and 9.8 parts by mass of the compound having Structural Formula (2) (as the phosphorescent light-emitting material) in 980 parts by mass of cyclohexane for electronics industry (product of KANTO KAGAKU) and by stirring the resultant mixture for 1 hour.

Example 10

An organic electroluminescence device was produced in the same manner as in Example 1, except that an emission layer (thickness: 40 nm) was formed by co-depositing the compound having Structural Formula (2) (as the phosphorescent light-emitting material) and the compound having Structural Formula (6) (as the host material) at a ratio by mass of 5:95 by a vacuum deposition method.

Example 11

A hole injection layer was formed in the same manner as in Example 1, except that the arylamine derivative was changed to PTPDES (trade name) (product of CHEMIPRO KASEI KAISHA, LTD., ionization potential (Ip=5.43 eV) (14 parts by mass) and that the phosphorescent light-emitting material was changed to a compound having Structural Formula (7) (Compound 11 described in U.S. Pat. WO2009/073245) (6 parts by mass).

Next, 10 parts by mass of a compound having the following Structural Formula (8) (HTL-1 described in U.S. Pat. No. 2008/0220265) serving as a hole transporting material was dissolved in 990 parts by mass of toluene (dehydrated) (product of Wako Pure Chemical Industries, Ltd.), to thereby prepare a hole transport layer-coating liquid. The hole injection layer was coated through spin coating with the hole transport layer-coating liquid, followed by drying at 200° C. for 30 min, to thereby form a hole transport layer having a thickness of 10 nm.

Then, an organic electroluminescence device was produced in the same manner as in Example 1, except that an emission layer (thickness: 30 nm) was formed on the above-formed hole transport layer by co-depositing the compound having Structural Formula (7) (as the phosphorescent light-emitting material) and a compound having Structural Formula (9) (as the host material) at a ratio by mass of 15:85.

Structural Formula (7)

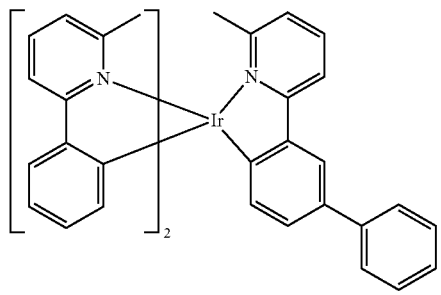

Structural Formula (8)

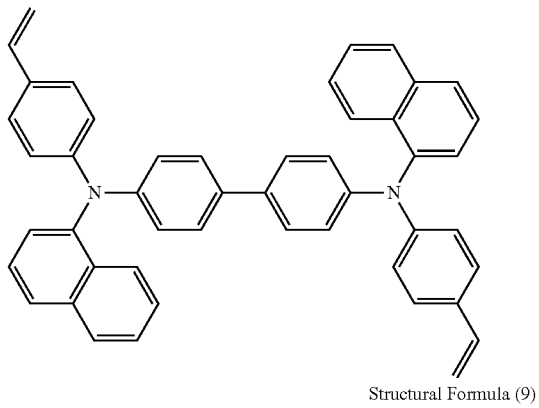

Structural Formula (9)

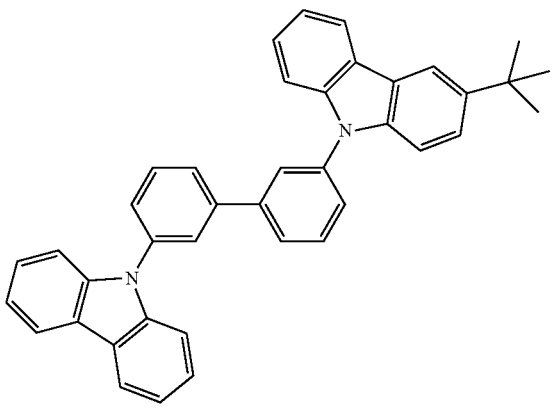

Example 12

An organic electroluminescence device was produced in the same manner as in Example 11, except that the compound having Structural Formula (8) (as the hole transporting material) and the compound having Structural Formula (7) (as the phosphorescent light-emitting material) were dissolved in toluene at a ratio by mass of 95:5.

Example 13

An organic electroluminescence device was produced in the same manner as in Example 11, except that the host material of the emission layer was changed to a compound having Structural Formula (10).

Structural Formula (10)

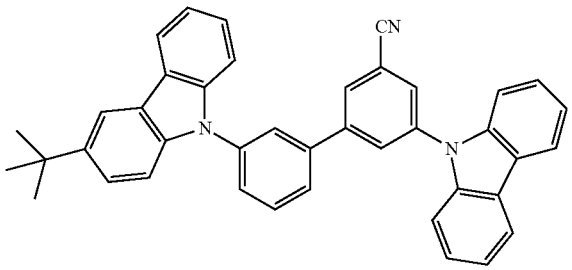

Comparative Example 5

An organic electroluminescence device was produced in the same manner as in Example 1, except that the hole injection layer was formed using a coating liquid which had been prepared by dissolving or dispersing 18.2 parts by mass of PTPDES-2 (as the arylamine derivative) and 1.8 parts by mass of the compound having Structural Formula (2) (as the phosphorescent light-emitting material) in 980 parts by mass of cyclohexanone for electronics industry (product of KANTO KAGAKU).

Comparative Example 6

An organic electroluminescence device was produced in the same manners as in Example 1, except that the hole injection layer was formed using a coating liquid which had been prepared by dissolving or dispersing 10 parts by mass of PTPDES-2 (as the arylamine derivative) and 10 parts by mass of the compound having Structural Formula (2) (as the phosphorescent light-emitting material) in 980 parts by mass of cyclohexanone for electronics industry (product of KANTO KAGAKU).

Comparative Example 7

An organic electroluminescence device was produced in the same manner as in Example 1, except that the hole transport layer was formed using a coating liquid which had been prepared by dissolving or dispersing 10.4 parts by mass of the compound having Structural Formula (4) (Mw=8,000) (as the arylamine derivative) and 2.6 parts by mass of the compound having Structural Formula (2) (as the phosphorescent light-emitting material) in 987 parts by mass of xylene for electronics industry (product of KANTO KAGAKU).

Comparative Example 8

An organic electroluminescence device was produced in the same manner as in Example 1, except that the hole transport layer was formed using a coating liquid which had been prepared by dissolving or dispersing 8.06 parts by mass of the compound having Structural Formula (4) (Mw=8,000) (as the arylamine derivative), 2.6 parts by mass of the compound having Structural Formula (2) (as the phosphorescent light-emitting material) and 2.34 parts by mass of the compound having Structural Formula (6) (as the host material) in 987 parts by mass of xylene for electronics industry (product of KANTO KAGAKU).

Comparative Example 9

An organic electroluminescence device was produced in the same manner as in Example 11, except that the hole injection layer was formed from only PTPDES.

(Evaluation)

Each of the phosphorescent light-emitting materials used in Examples 1 to 13 and Comparative Examples 1 to 9 were measured for saturation solubility and thermodecomposition temperature as follows.

<Measurement of Saturation Solubility>

Using cyclohexanone as a solvent, saturation solutions of the phosphorescent light-emitting materials (Ir complexes) used in Examples 1 to 13 and Comparative Examples 1 to 9 were prepared. Separately, solutions having different concentrations for obtaining a calibration curve (0.05 wt % and 0.1 wt %) were prepared. Each solution was measured for absorbance with a spectrophotometer (product of Shimadzu Corporation, trade name "UV-3600"). The saturation solubility of each Ir complex was measured on the basis of the ratio between the obtained absorbances. The results are shown in Table 1.

<Measurement of Thermodecomposition Temperature>

Using a thermogravimetry differential thermal analyzer (product of SII Nano Technology Inc., trade name "EXSTAR TG/DTA6000"), each of the Ir complex-saturation solutions was heated to 500° C. at a temperature increasing rate of 10° C./min in a nitrogen atmosphere for measuring a change in weight. The temperature at which the weight was changed by 1% was defined as the thermodecomposition temperature. The results are shown in Table 1.

TABLE 1

|  | Saturation solubility (wt %) | Thermodecomposition Temperature (° C.) |
|---|---|---|
| Structural Formula (1) | 0.07 | 355 |
| Firpic | 1.8 | 327 |
| Structural Formula (2) | 2.9 | 276 |
| Structural Formula (7) | >4 | 320 |

As is clear from Table 1, the Ir complexes having different ligands were found to exhibit high solubility. In particular, the complex having Structural Formula (7), whose ligands are coordinated via only C and N, was found to exhibit remarkably high solubility. In addition, the complex having Structural Formula (7) was found to have a thermodecomposition temperature higher than that of the complex having Structural Formula (2) which is an acac complex having high solubility, and thus to have excellent stability.

Next, each of the above-produced organic electroluminescence devices of Examples 1 to 13 and Comparative Examples 1 to 9 as shown in Table 2 was measured as follows for external quantum efficiency and Turn On voltage (a voltage at which each organic electroluminescence device begins to emit light).

Notably, the concentration of the phosphorescent light-emitting material in each layer of the organic electroluminescence device of Example 3 was measured based on the Ir concentration profile obtained through secondary ion mass spectrometry. Also, the host material was considered as permeating underlying layers similar to the phosphorescent light-emitting material.

<Measurement of External Quantum Efficiency>

Using source measure unit 2400 (product of TOYO Corporation), DC voltage was applied to each device for light emission. The emission spectrum and brightness were measured with spectrum analyzer SR-3 (product of TOPCON CORPORATION). On the basis of the obtained values, the external quantum efficiency at 10 mA/cm$^2$ (current) was calculated by a brightness conversion method. The results are shown in Tables 3-1 and 3-2.

Notably, in Tables 3-1, 3-2 and 4, the external quantum efficiency in Comparative Example 1 was used as a reference. The external quantum efficiencies in the other Examples and Comparative Examples were expressed as relative values to the external quantum efficiency in Comparative Example 1 (i.e., which was regarded as 1).

Furthermore, in the column "Lamination coating" in Table 3-2, "Performable" means that the hole transport layer could be formed on the hole injection layer through coating, and "Not performable" means that the hole transport layer could not be formed on the hole injection layer through coating. Table 4 shows actual measurement values of external quantum efficiency in Examples 11 to 13 and Comparative Example 9.

<Measurement of Turn on Voltage>

Using source meter 2400 (product of Keithley Instruments Inc.), the voltage at 0.025 mA/cm$^2$ (current density) was measured.

<Evaluation of Turn on Voltage>

On the basis of the Turn On voltage in Comparative Example 1 (reference), the Turn On voltages in the other Examples and Comparative Examples were expressed as "Lower than reference," "Equal to reference" or "Higher than reference." The results are shown in Tables 3-1, 3-2 and 4.

TABLE 2

|  | Hole injection layer Phosphorescent light-emitting material | Hole injection layer Host material | Hole transport layer Phosphorescent light-emitting material | Hole transport layer Host material | Hole transport layer Hole transport material | Emission layer Phosphorescent light-emitting material | Emission layer Host material |
|---|---|---|---|---|---|---|---|
| Ex. 1 | S.F. (2) | — | — | — | S.F. (4) | S.F. (2) | S.F. (6) |
| Ex. 2 | S.F. (2) | — | S.F. (2) | S.F. (6) | S.F. (4) | S.F. (2) | S.F. (6) |
| Ex. 3 | S.F. (2) | — | S.F. (2) | S.F. (6) | S.F. (4) | S.F. (2) | S.F. (6) |
| Ex. 4 | S.F. (2) | — | S.F. (2) | — | S.F. (4) | S.F. (2) | S.F. (6) |
| Ex. 5 | S.F. (2) | — | S.F. (2) | — | S.F. (4) | S.F. (2) | S.F. (6) |
| Ex. 6 | S.F. (1) | — | S.F. (1) | S.F. (6) | S.F. (4) | S.F. (2) | S.F. (6) |
| Ex. 7 | Firpic | — | Firpic | S.F. (6) | S.F. (4) | S.F. (2) | S.F. (6) |
| Ex. 8 | S.F. (2) | — | — | — | S.F. (4) | S.F. (2) | S.F. (6) |
| Ex. 9 | S.F. (2) | — | — | — | S.F. (4) | S.F. (2) | S.F. (6) |
| Ex. 10 | S.F. (2) | — | — | — | S.F. (4) | S.F. (2) | S.F. (6) |
| Ex. 11 | S.F. (7) | — | — | — | S.F. (8) | S.F. (7) | S.F. (9) |
| Ex. 12 | S.F. (7) | — | S.F. (7) | — | S.F. (8) | S.F. (7) | S.F. (9) |
| Ex. 13 | S.F. (7) | — | — | — | S.F. (8) | S.F. (7) | S.F. (10) |
| Comp. Ex. 1 | — | — | — | — | S.F. (4) | S.F. (2) | S.F. (6) |
| Comp. Ex. 2 | — | — | S.F. (2) | S.F. (6) | S.F. (4) | S.F. (2) | S.F. (6) |
| Comp. Ex. 3 | S.F. (2) | — | — | — | S.F. (4) | S.F. (2) | S.F. (6) |
| Comp. Ex. 4 | S.F. (2) | — | — | — | S.F. (4) | S.F. (2) | S.F. (6) |
| Comp. Ex. 5 | S.F. (2) | — | — | — | S.F. (4) | S.F. (2) | S.F. (6) |
| Comp. Ex. 6 | S.F. (2) | — | — | — | S.F. (4) | S.F. (2) | S.F. (6) |
| Comp. Ex. 7 | S.F. (2) | — | S.F. (2) | — | S.F. (4) | S.F. (2) | S.F. (6) |
| Comp. Ex. 8 | S.F. (2) | — | S.F. (2) | S.F. (6) | S.F. (4) | S.F. (2) | S.F. (6) |
| Comp. Ex. 9 | — | — | — | — | S.F. (8) | S.F. (7) | S.F. (9) |

Note:
"S.F." is an abbreviation of Structural Formula.

TABLE 3-1

|  | Hole injection layer Conc. of phosphorescent light-emitting material (% by mass) | Hole injection layer Conc. of host material (% by mass) | Hole transport layer Conc. of phosphorescent light-emitting material (% by mass) | Hole transport layer Conc. of host material (% by mass) | Emission layer Conc. of phosphorescent light-emitting material (% by mass) | Emission layer Conc. of host material (% by mass) |
|---|---|---|---|---|---|---|
| Ex. 1 | 30 | 0 | 0 | 0 | 10 | 90 |
| Ex. 2 | 30 | 0 | 2 | 18 | 10 | 90 |
| Ex. 3 | 30 | 0 | Phosphorescent light-emitting material and host material were diffused from emission layer and each had a concentration gradient | | 10 | 90 |
| Ex. 4 | 30 | 0 | 2 | 0 | 10 | 90 |
| Ex. 5 | 45 | 0 | 3 | 0 | 10 | 90 |
| Ex. 6 | 30 | 0 | 2 | 18 | 10 | 90 |
| Ex. 7 | 30 | 0 | 2 | 18 | 10 | 90 |
| Ex. 8 | 11 | 0 | 0 | 0 | 10 | 90 |
| Ex. 9 | 49 | 0 | 0 | 0 | 10 | 90 |

TABLE 3-1-continued

| | Hole injection layer Conc. of phosphorescent light-emitting material (% by mass) | Hole injection layer Conc. of host material (% by mass) | Hole transport layer Conc. of phosphorescent light-emitting material (% by mass) | Hole transport layer Conc. of host material (% by mass) | Emission layer Conc. of phosphorescent light-emitting material (% by mass) | Emission layer Conc. of host material (% by mass) |
|---|---|---|---|---|---|---|
| Ex. 10 | 30 | 0 | 0 | 0 | 5 | 95 |
| Ex. 11 | 30 | 0 | 0 | 0 | 15 | 85 |
| Ex. 12 | 30 | 0 | 5 | 0 | 15 | 85 |
| Ex. 13 | 30 | 0 | 0 | 0 | 15 | 85 |
| Comp. Ex. 1 | 0 | 0 | 0 | 0 | 10 | 90 |
| Comp. Ex. 2 | 0 | 0 | 2 | 18 | 10 | 90 |
| Comp. Ex. 3 | 80 | 0 | 0 | 0 | 10 | 90 |
| Comp. Ex. 4 | 55 | 0 | 0 | 0 | 10 | 90 |
| Comp. Ex. 5 | 9 | 0 | 0 | 0 | 10 | 90 |
| Comp. Ex. 6 | 50 | 0 | 0 | 0 | 10 | 90 |
| Comp. Ex. 7 | 30 | 0 | 20 | 0 | 10 | 90 |
| Comp. Ex. 8 | 30 | 0 | 20 | 18 | 10 | 90 |
| Comp. Ex. 9 | 0 | 0 | 0 | 0 | 15 | 85 |

TABLE 3-2

| | Relative external quantum efficiency | Turn On voltage | Lamination coating | Remarks |
|---|---|---|---|---|
| Ex. 1 | 1.4 | Lower than ref. | Performable | — |
| Ex. 2 | 1.7 | Lower than ref. | Performable | — |
| Ex. 3 | 1.8 | Lower than ref. | Performable | Emission layer was formed through coating |
| Ex. 4 | 1.5 | Lower than ref. | Performable | — |
| Ex. 5 | 1.7 | Lower than ref. | Performable | — |
| Ex. 6 | 1.3 | Lower than ref. | Performable | Phosphorescent light-emitting material: Ir(ppy)$_3$ (Ip = 5.45 eV) Dark spots existed |
| Ex. 7 | 1.3 | Lower than ref. | Performable | Phosphorescent light-emitting material: Firpic (Ip = 5.8 eV) Low durability |
| Ex. 8 | 1.3 | Lower than ref. | Performable | — |
| Ex. 9 | 1.4 | Lower than ref. | Performable | — |
| Ex. 10 | 1.3 | Lower than ref. | Performable | — |
| Ex. 11 | — | — | Performable | — |
| Ex. 12 | — | — | Performable | — |
| Ex. 13 | — | — | Performable | — |
| Comp. Ex. 1 | 1.0 | Reference (ref.) | Performable | — |
| Comp. Ex. 2 | 1.2 | Equal to ref. | Performable | — |
| Comp. Ex. 3 | Not evaluated | Not evaluated | Not performable | Hole injection layer dissolved |
| Comp. Ex. 4 | Not evaluated | Not evaluated | Not performable | Hole injection layer dissolved |
| Comp. Ex. 5 | 1.0 | Equal to ref. | Performable | Not effective |
| Comp. Ex. 6 | 0.9 | Lower than ref. | Performable | Electron transport layer emitted light |
| Comp. Ex. 7 | 0.9 | Lower than ref. | Performable | Electron transport layer emitted light |
| Comp. Ex. 8 | 0.9 | Lower than ref. | Performable | Electron transport layer emitted light |
| Comp. Ex. 9 | — | — | Performable | — |

TABLE 4

|  | External quantum efficiency (%) | Turn On voltage (V) |
|---|---|---|
| Ex. 11 | 4.0 | 8.2 |
| Ex. 12 | 4.7 | 8.2 |
| Ex. 13 | 5.2 | 7.5 |
| Comp. Ex. 9 | 3.9 | 8.4 |

From Tables 3-1 and 3-2, the organic electroluminescence devices of Comparative Examples 1 to 9 were found to be higher in external quantum efficiency than those of Examples 1 to 13 in which the amount of the phosphorescent light-emitting material contained in the hole injection layer was 10% by mass or more but less than 50% by mass, the concentration of the phosphorescent light-emitting material contained in the hole transport layer was lower than that in the hole injection layer, and the concentration of the phosphorescent light-emitting material contained in the emission layer was lower than that in the hole injection layer and higher than that in the hole transport layer.

Also, from Tables 3-1 and 3-2, the hole transport layer was found to have concentration gradients of the phosphorescent light-emitting material and the host material in the organic electroluminescence device of Example 3 whose emission layer was formed through coating.

Furthermore, from Tables 3-1 and 3-2, when the concentration of the phosphorescent light-emitting material contained in the hole injection layer was higher than 50%, the hole transport layer could not be formed thereon through coating (i.e., lamination coating was not performable) since the hole injection layer dissolved in the coating liquid used for the formation of the hole transport layer.

Moreover, use of the compound having Structural Formula (1) as the phosphorescent light-emitting material was found to generate dark spots as a result of aggregation, since this compound has low dissolvability to a solvent used for coating. Here, the "dark spots" are regions where light is emitted.

Also, the organic electroluminescence device containing Firpic as the phosphorescent light-emitting material was found to be low in durability. Notably, durability was evaluated by measuring the time required that the initial brightness (1,000 cd/m$^2$) was decreased by half during driving at a constant current.

Moreover, from Table 4, when the phosphorescent light-emitting material was incorporated into the hole injection layer, the external quantum efficiency was found to be improved and the Turn On voltage was found to decrease. In particular, when the phosphorescent light-emitting material was also incorporated into the hole transport layer, more improved performances were found to be obtained. In addition, use of the host having a nitrile group was found to provide more improved performances.

INDUSTRIAL APPLICABILITY

The organic electroluminescence devices of the present invention can attain excellent light-emission efficiency and long light-emission time, and thus, can be suitably used in, for example, display devices, displays, backlights, electrophotography, illuminating light sources, recording light sources, exposing light sources, reading light sources, markers, interior accessories and optical communication.

REFERENCE SINGS LIST

1 Substrate
2 Anode
3 Hole injection layer
4 Hole transport layer
5 Emission layer
6 Electron transport layer
7 Electron injection layer
8 Cathode
10 Organic electroluminescence device

The invention claimed is:
1. An organic electroluminescence device comprising:
an anode,
a cathode,
an organic layer disposed between the anode and the cathode,
the organic layer containing a hole injection layer, a hole transport layer and an emission layer containing a host material,
wherein the hole injection layer, the hole transport layer and the emission layer each contain a phosphorescent light-emitting material,
wherein the phosphorescent light-emitting material in the hole injection layer, the hole transport layer and the emission layer are each the same,
wherein the hole injection layer contains the phosphorescent light-emitting material in an amount of 10% by mass or more but less than 50% by mass, and
wherein a concentration of the phosphorescent light-emitting material contained in the hole transport layer is lower than that in the hole injection layer, and a concentration of the phosphorescent light-emitting material contained in the emission layer is lower than that in the hole injection layer and higher than that in the hole transport layer,
wherein the host material is selected from the group consisting of a compound represented by General Formula (2) or General Formula (3):

General Formula (2)

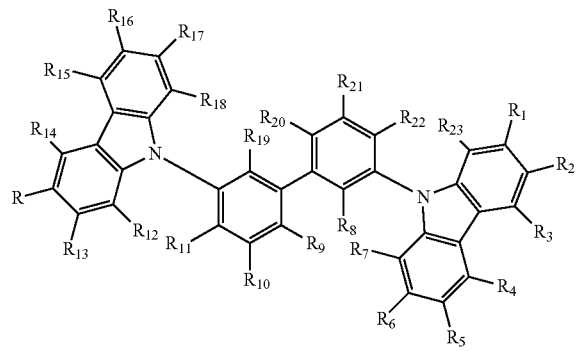

where R represents a t-butyl group, a t-amyl group, a trimethylsilyl group, or a triphenylsilyl group, and $R_1$ to $R_{23}$ each represent a hydrogen atom, a C1-C5 alkyl group, a cyano group, a fluorine atom, a trifluoro group, a trimethylsilyl group, a triphenylsilyl group or a phenyl group;

General Formula (3)

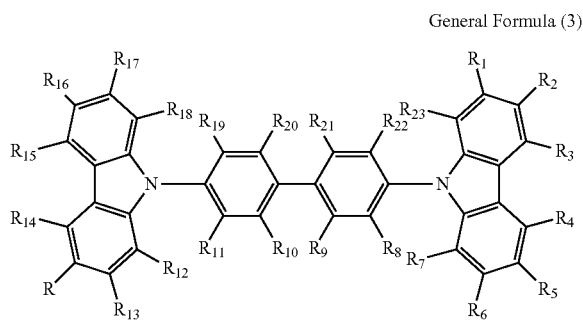

where R represents a t-butyl group, a t-amyl group, a trimethylsilyl group, a triphenylsilyl group or a phenyl group, and $R_1$ to $R_{23}$ each represent a hydrogen atom, a C1-C5 alkyl group, a cyano group, a fluorine atom, a trifluoro group, a trimethylsilyl group, a triphenylsilyl group or a phenyl group, with the proviso that at least one of R, $R_2$, $R_4$, and $R_{16}$, is a hydrogen.

2. The organic electroluminescence device according to claim 1, wherein the hole transport layer further contains the host material.

3. The organic electroluminescence device according to claim 2, wherein a ratio by mass of the phosphorescent light-emitting material to the host material in the emission layer is one to ten times a ratio by mass of the phosphorescent light-emitting material to the host material in the hole transport layer.

4. The organic electroluminescence device according to claim 1, wherein the concentration of the phosphorescent light-emitting material contained in the hole transport layer is changed from an interface between the hole transport layer and the emission layer to an interface between the hole transport layer and the hole injection layer.

5. The organic electroluminescence device according to claim 2, wherein the concentration of the host material contained in the hole transport layer is changed from an interface between the hole transport layer and the emission layer to an interface between the hole transport layer and the hole injection layer.

6. The organic electroluminescence device according to claim 1, wherein at least one phosphorescent light-emitting material has an asymmetric structure.

7. The organic electroluminescence device according to claim 1, wherein at least one phosphorescent light-emitting material is a compound represented by General Formula (1) below:

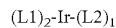  General Formula (1)

where L1 denotes a ligand and L2 denotes a ligand different from L1.

8. The organic electroluminescence device according to claim 1, wherein the hole injection layer further contains an arylamine derivative and an ionization potential of the arylamine derivative is 4.8 eV to 5.8 eV and wherein a difference between the ionization potential of the arylamine derivative and an ionization potential of the phosphorescent light-emitting material contained in the hole injection layer is within ±0.2 eV.

9. An organic electroluminescence device-producing method for producing the organic electroluminescence device according to claim 1, comprising:
forming the hole injection layer, the hole transport layer and the emission layer through coating.

10. The organic electroluminescence device-producing method according to claim 9, wherein the phosphorescent light-emitting material is soluble to a solvent used for the coating.

11. The organic electroluminescence device according to claim 1, wherein the hole injection layer contains the phosphorescent light-emitting material in an amount of 25% by mass or more but less than 50% by mass.

* * * * *